United States Patent
Guo et al.

(10) Patent No.: US 12,100,776 B2
(45) Date of Patent: Sep. 24, 2024

(54) PHOTOVOLTAIC MODULE AND METHOD FOR PRODUCING THE SAME

(71) Applicants: ZHEJIANG JINKO SOLAR CO., LTD., Zhejiang (CN); JINKO SOLAR CO., LTD., Jiangxi (CN)

(72) Inventors: Zhiqiu Guo, Zhejiang (CN); Yidong Hu, Zhejiang (CN); Yichao Yao, Zhejiang (CN)

(73) Assignees: ZHEJIANG JINKO SOLAR CO., LTD., Haining Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/069,217

(22) Filed: Dec. 20, 2022

(65) Prior Publication Data

US 2024/0120426 A1 Apr. 11, 2024

(30) Foreign Application Priority Data

Sep. 30, 2022 (CN) .......................... 202222621633.7
Oct. 13, 2022 (CN) .......................... 202211255687.4

(Continued)

(51) Int. Cl.
*H01L 31/05* (2014.01)
*H01L 31/18* (2006.01)

(52) U.S. Cl.
CPC ........ *H01L 31/0508* (2013.01); *H01L 31/186* (2013.01)

(58) Field of Classification Search
CPC .................................................. H01L 31/0508
See application file for complete search history.

(56) References Cited

U.S. PATENT DOCUMENTS

| 2016/0016262 A1 | 1/2016 | Tsipis |
| 2019/0189819 A1 | 6/2019 | Zhou et al. |
| 2019/0198691 A1 | 6/2019 | Fan et al. |

FOREIGN PATENT DOCUMENTS

| CN | 103480966 A | 1/2014 |
| CN | 203984345 U | 12/2014 |

(Continued)

OTHER PUBLICATIONS

Zhejiang Jinko Solar Co., Ltd., et al., Extended European Search Report. EP 22217028.4, Aug. 17, 2023, 8 pgs.

(Continued)

*Primary Examiner* — Golam Mowla
(74) *Attorney, Agent, or Firm* — USCH Law, PC

(57) ABSTRACT

Embodiments of the present disclosure relates to a photovoltaic module and a method for producing the photovoltaic module. The photovoltaic module includes a photovoltaic laminate and a junction box. The photovoltaic laminate includes a plurality of solar cells, at least one solder strip, a rear plate and a wiring member. The at least one solder strip is electrically connected with the wiring member. The junction box includes a bonding pad. The wiring member passes through an opening defined on the rear plate and abuts the bonding pad, and the wiring member is connected with the bonding pad by laser welding. A plurality of weld seams are formed in a welding region. Each weld seam extends from the wiring member towards interior of the bonding pad, and an extension depth of each weld seam in the bonding pad is not greater than 80% of a thickness of the bonding pad.

19 Claims, 11 Drawing Sheets

(30) Foreign Application Priority Data

Oct. 13, 2022 (CN) .......................... 202211255736.4
Oct. 13, 2022 (CN) .......................... 202222714739.1

(56) References Cited

FOREIGN PATENT DOCUMENTS

| | | |
|---|---|---|
| CN | 207154951 U | 3/2018 |
| CN | 208556647 U | 3/2019 |
| CN | 111805087 A | 10/2020 |
| CN | 213817690 U | 7/2021 |
| CN | 113765478 A | 12/2021 |
| CN | 113967791 A | 1/2022 |
| CN | 114039260 A | 2/2022 |
| CN | 114226938 A | 3/2022 |
| CN | 114799525 A | 7/2022 |
| DE | 102011052928 A1 | 8/2012 |
| JP | 2013016531 A | 1/2013 |
| JP | 2015142430 A | 8/2015 |
| JP | 2016082025 A | 5/2016 |
| JP | 2017168267 A | 9/2017 |
| JP | 2020523768 A | 8/2020 |
| WO | 2021208456 A1 | 10/2021 |
| WO | WO 2022/138619 A1 * 6/2022 ......... H01L 31/0224 |

OTHER PUBLICATIONS

Zhejiang Jinko Solar Co., Ltd., et al., Notice of acceptance for your patent application, AU 2022291656, Nov. 14, 2023, 4 pgs.
Star Hongyi Laser Co., Ltd., Monitoring laser welding machine by optical signal detection, Aug. 23, 2014, 2 pgs. http://www.xhylaser.com/view_585.html.

* cited by examiner

PHOTOVOLTAIC MODULE AND METHOD FOR PRODUCING THE SAME

CROSS REFERENCE TO RELATED APPLICATIONS

The present application claims the benefit of priority under the Paris Convention to Chinese Patent Application No. 202222714739.1 filed on Oct. 13, 2022, Chinese Patent Application No. 202222621633.7 filed on Sep. 30, 2022, Chinese Patent Application No. 202211255687.4 filed on Oct. 13, 2022, and Chinese Patent Application No. 202211255736.4 filed on Oct. 13, 2022, each of which is incorporated herein by reference in its entirety.

TECHNICAL FIELD

Embodiments of the present disclosure relate to the field of photovoltaic new energy, and in particular to a photovoltaic module and a method for producing the photovoltaic module.

BACKGROUND

With the development of science and technology, photovoltaic technology has also developed rapidly. Photovoltaic technology refers to a technology that can directly convert solar light energy into electrical energy. In specific implementation of photovoltaic technology, a light receiving surface of a photovoltaic laminate is used to receive light radiated from the sun, and solar energy is converted into electrical energy by cell strings in the photovoltaic laminate. Then, the electrical energy obtained from the cell strings in the photovoltaic laminate is transferred to a junction box by a wiring member of the photovoltaic laminate, and the electrical energy is outputted from the junction box for use.

Before the electrical energy obtained from the cell strings in the photovoltaic laminate is transferred to the junction box by the wiring member of the photovoltaic laminate, the wiring member of the photovoltaic laminate is fixed and electrically connected with a bonding pad of the junction box. However, in the relevant technology, after the wiring member of the photovoltaic laminate is fixed and electrically connected with the bonding pad of the junction box, the reliability of the electrical connection between the wiring member and the bonding pad is poor, which leads to poor stability and low efficiency of the output of the photo-generated current from the photovoltaic laminate.

SUMMARY

Embodiments of the present disclosure aim to provide a photovoltaic module and a method for producing the photovoltaic module, in order to improve the reliability of the electrical connection of the junction box in the photovoltaic module and the efficiency of the output of the photo-generated current from the photovoltaic laminate.

To this end, some embodiments of the present disclosure provide a photovoltaic module including a photovoltaic laminate and a junction box. The photovoltaic laminate includes a plurality of solar cells, at least one solder strip, a rear plate and a wiring member. The plurality of solar cells are electrically connected by the at least one solder strip to form at least one cell string stacked over the rear plate, and the at least one solder strip is electric ally connected with the wiring member. The junction box is fixed and connected to the rear plate on a side of the rear plate away from the plurality of solar cells, and the junction box includes a bonding pad. The wiring member passes through an opening defined on the rear plate and abuts the bonding pad, and the wiring member is connected with the bonding pad by laser welding. A plurality of weld seams are formed in a welding region, the welding region refers to a region between the wiring member and the bonding pad in which the laser welding is performed. The plurality of weld seams are configure to connect the wiring member and the bonding pad to form an integrated structure. Each of the plurality of weld seams extends from the wiring member towards an interior of the bonding pad, and an extension depth of each of the plurality of weld seams in the bonding pad is not greater than 80% of a thickness of the bonding pad.

Some embodiments of the present disclosure provide a method for producing a photovoltaic module, including: providing a photovoltaic laminate including a plurality of solar cells, at least one solder strip, a rear plate and a wiring member, the plurality of solar cells are electrically connected by the at least one solder strip to form at least one cell string stacked over the rear plate, and the at least one solder strip is electrically connected with the wiring member; providing a junction box being fixed and connected to the rear plate on a side of the rear plate away from the plurality of solar cells, and the junction box includes a bonding pad; passing the wiring member through an opening defined on the rear plate and abutting the wiring member on the bonding pad; and performing laser welding on the wiring member and the bonding pad, to connect the wiring member with the bonding pad. A plurality of weld seams are formed in a welding region, the welding region refers to a region between the wiring member and the bonding pad in which the laser welding is performed. The plurality of weld seams are configure to connect the wiring member and the bonding pad to form an integrated structure. Each of the plurality of weld seams extends from the wiring member towards an interior of the bonding pad, and an extension depth of each of the plurality of weld seams in the bonding pad is not greater than 80% of a thickness of the bonding pad.

BRIEF DESCRIPTION OF THE DRAWINGS

One or more embodiments are exemplarily illustrated in reference to corresponding accompanying drawing(s), and these exemplary illustrations do not constitute limitations on the embodiments. Elements with the same or similar reference numerals in the drawings represent the same or similar elements. Unless otherwise stated, the accompanying drawings do not constitute scale limitations.

DETAILED DESCRIPTION OF THE EMBODIMENTS

Figure 1:
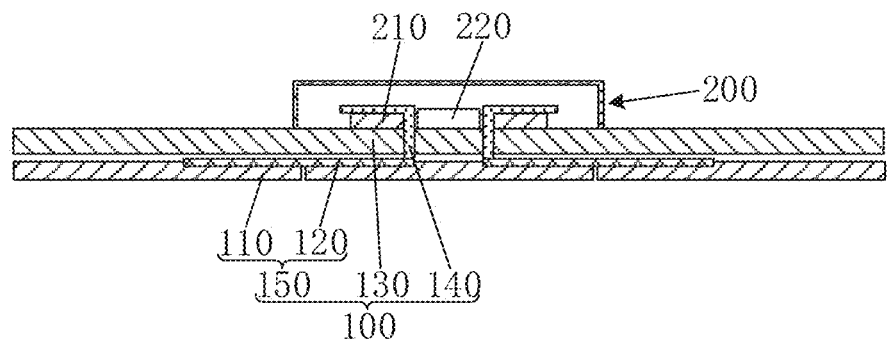
FIG. 1 is a sectional view of the photovoltaic module according to some embodiments of the present disclosure.

In the related art, during the production of the photovoltaic module, the wiring member is fixed with the bonding pad in the junction box by thermocompression bonding. The bonding pad is a component of the junction box for fixing with the wiring member. That is to say, in a connection structure of the wiring member and the junction box of the photovoltaic module, metal tin is filled between the wiring member and the bonding pad, and the metal tin comes from the solder paste in the thermocompression bonding. The wiring member and the bonding pad of the junction box are fixed to each other by the metal tin. Due to the large difference between the metal materials of the wiring member and the bonding pad and the metal tin, the strength of the interface connection formed in the connection process is easy to be affected by changes in external conditions. For example, in the working process of photovoltaic modules, due to the dramatic changes in the temperature conditions of the environment, the connection interface between the wiring member and the bonding pad formed by metal tin is likely to delaminate due to different expansion degrees, leading to desoldering. Moreover, due to the influence of the surface flatness of the wiring member and the bonding pad on the spreading direction of the melted solder paste during the welding process, cold joint is likely to occur. Furthermore, in addition to the metal tin between the wiring member and the bonding pad coming from the soldering paste for the thermocompression bonding, metal tin is also distributed around the wiring member and the bonding pad. The above phenomena affect the connection reliability of the junction box in the photovoltaic module, thereby resulting in poor stability and low efficiency of the output of the photo-generated current from the photovoltaic laminate.

Aiming at this, some embodiments of the present disclosure provide a photovoltaic module including a photovoltaic laminate and a junction box. The photovoltaic laminate includes a plurality of solar cells, at least one solder strip, a rear plate and a wiring member. The plurality of solar cells are electrically connected by the at least one solder strip to form at least one cell string stacked over the rear plate, and the at least one solder strip is electrically connected with the wiring member. The junction box is fixed and connected to the rear plate on a side of the rear plate away from the plurality of solar cells, and the junction box includes a bonding pad. The wiring member passes through an opening defined on the rear plate and abuts the bonding pad, and the wiring member is connected with the bonding pad by laser welding. A plurality of weld seams are formed in a welding region, the welding region refers to a region between the wiring member and the bonding pad in which the laser welding is performed. The plurality of weld seams are configure to connect the wiring member and the bonding pad to form an integrated structure. Each of the plurality of weld seams extends from the wiring member towards an interior of the bonding pad, and an extension depth of each of the plurality of weld seams in the bonding pad is not greater than 80% of a thickness of the bonding pad.

When in use, a light receiving surface of the photovoltaic laminate of the photovoltaic module is used to receive the light radiated from the sun. The solar energy is converted into electrical energy by cell strings in the photovoltaic laminate, then the obtained electrical energy is transferred to the junction box by the wiring member. With the wiring member functioning as a connection part, the cell strings in the photovoltaic module are connected, together with the junction box, to an external circuit. In this way, the electrical energy is outputted for use.

In the photovoltaic module according to the present disclosure, a plurality of weld seams are formed, by laser welding, in a region between the wiring member and the bonding pad of the junction box in which the laser welding is performed, the plurality of weld seams penetrate the wiring member and extend to the interior of the bonding pad. The wiring member and the metal material of the bonding pad form an integrated structure at the plurality of weld seams. Thus, a secure connection structure can be formed by laser welding performed on the wiring member and the bonding pad of the junction box. The metal material of the wiring member and the metal material of the bonding pad are melted and integrated under the action of the laser, and no metal tin is needed to implement connection. In this way, an integrated structure with high connection strength can be formed at the connection interface between the wiring member and the bonding pad of the junction box. In particular when the wiring member and the bonding pad of the junction box are made of copper, the connection reliability between them can be further ensured through the fusion of metals of the same kind. Moreover, a thin tin layer may be arranged around the wiring member and the bonding pad during laser welding, which can prevent oxidation of metal copper at the surface of the wiring member or of the bonding pad. In this way, the electrical connection between the wiring member and the bonding pad can be free of cold joint and poor contact that occur in the welding using tin in the relevant technology, thereby improving the stability and efficiency of the output of the photo-generated current from the photovoltaic laminate.

In the photovoltaic module, during the arrangement of the junction box, the photovoltaic laminate is formed first. The photovoltaic laminate may be obtained by providing a front encapsulation adhesive film, a rear encapsulation adhesive film, a front protective plate and a rear protective plate stacked on either sides of cell string set and laminating them. After obtaining the photovoltaic laminate, the junction box is fixed on a surface of the photovoltaic laminate, and a part of the wiring member connected with the cell strings is introduced in the junction box. The junction box is equipped with a diode and a circuit structure formed by cables. The diode mainly plays an anomaly protection role for the cell string set. The cables are configured to implement the electrical connection with an external electronic control device.

In general, the junction box is arranged on the rear surface of the photovoltaic laminate, that is, on the surface of the rear protective plate for the cell string set in the photovoltaic laminate. Moreover, one or more junction boxes may be arranged on the photovoltaic laminate. For example, the number of the junction boxes arranged on the photovoltaic laminate may be 2 to 6, preferably 3. Furthermore, the junction box may be arranged near an edge of the photovoltaic laminate or near the center of the photovoltaic laminate. When the junction box is arranged near the center of the photovoltaic laminate, it is preferentially arranged on a centerline of the photovoltaic laminate, and is further preferentially arranged on a centerline of a long side of the photovoltaic laminate. There is at least one diode inside each junction box arranged on the photovoltaic laminate, and the electrical connection between the at least one diode and the wiring member in a photovoltaic module is implemented according to the present disclosure.

In order to make the purposes, technical solutions and advantages of the embodiments more clear, embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be realized.

Referring to FIGS. 1 to 7, some embodiments of the present disclosure provide a photovoltaic module including a photovoltaic laminate 100 and a junction box 200. The photovoltaic laminate 100 includes a plurality of solar cells 110, at least one solder strip 120, a rear plate 130 and a wiring member 140. The plurality of solar cells 110 are electrically connected by the at least one solder strip 120 to form at least one cell string 150 stacked over the rear plate 130, and the at least one solder strip 120 is electrically connected with the wiring member 140. The junction box 200 is fixed and connected to the rear plate 130 on a side of the rear plate 130 away from the plurality of solar cells 110, and the junction box 200 includes a bonding pad 210. The wiring member 140 passes through an opening defined on the rear plate 130 and abuts the bonding pad 210, and the wiring member 140 is connected with the bonding pad 210 by laser welding. A plurality of weld seams 310 are formed in a welding region, the welding region refers to a region between the wiring member 140 and the bonding pad 210 in which the laser welding is performed. The plurality of weld seams 310 are configure to connect the wiring member 140 and the bonding pad 210 to form an integrated structure. Each of the plurality of weld seams 310 extends from the wiring member 140 towards an interior of the bonding pad 210, and an extension depth of each of the plurality of weld seams 310 in the bonding pad 210 is not greater than 80% of a thickness of the bonding pad 210.

It should be noted that the photovoltaic laminate 100 herein may further include other components, which are not limited in the present disclosure. In some embodiments, the photovoltaic laminate 100 further includes an adhesive film (not shown in the drawings) arranged between the cell string 150 and the rear plate 130. In some embodiments, the photovoltaic laminate 100 further includes a front plate (not shown in the drawings) arranged on a side of the cell string 150 away from the rear plate 130. In this case, an adhesive film (not shown in the drawings) may also be arranged between the front plate and the cell string 150.

Figure 2:
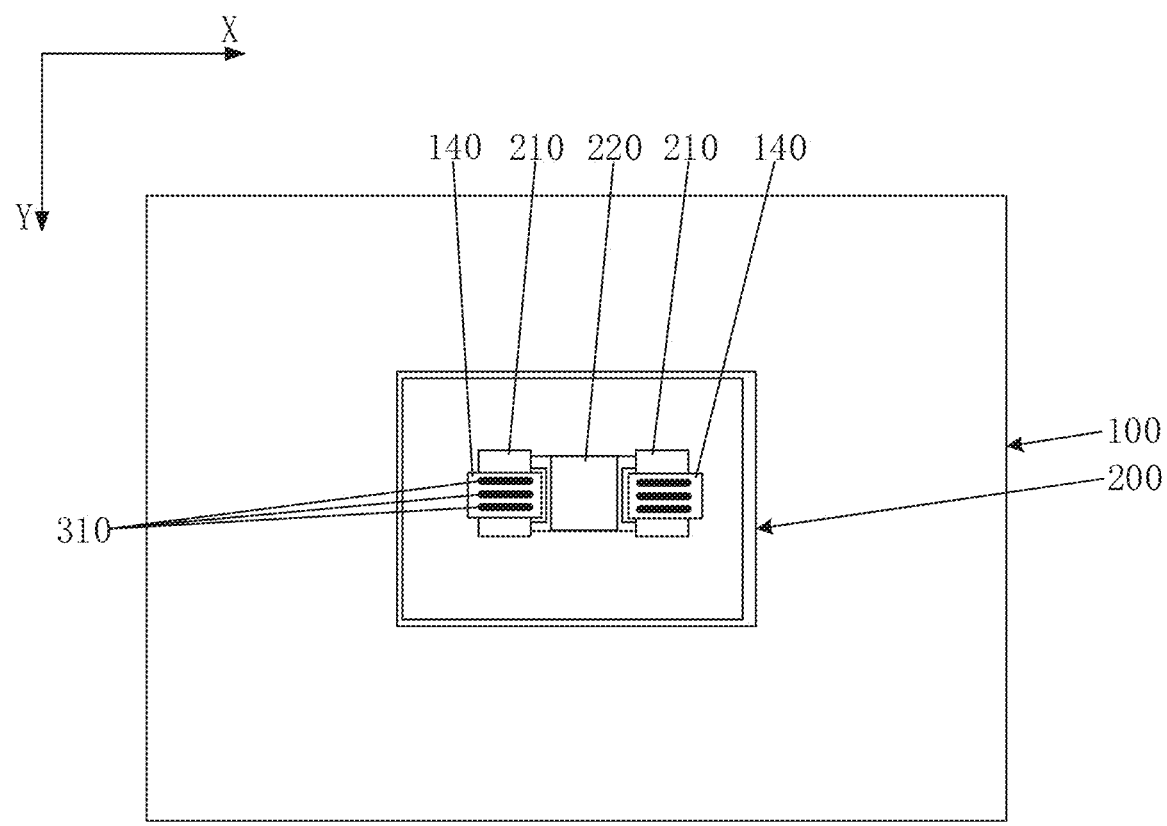
FIG. 2 is a top view of the photovoltaic module according to some embodiments of the present disclosure.
Figure 3:
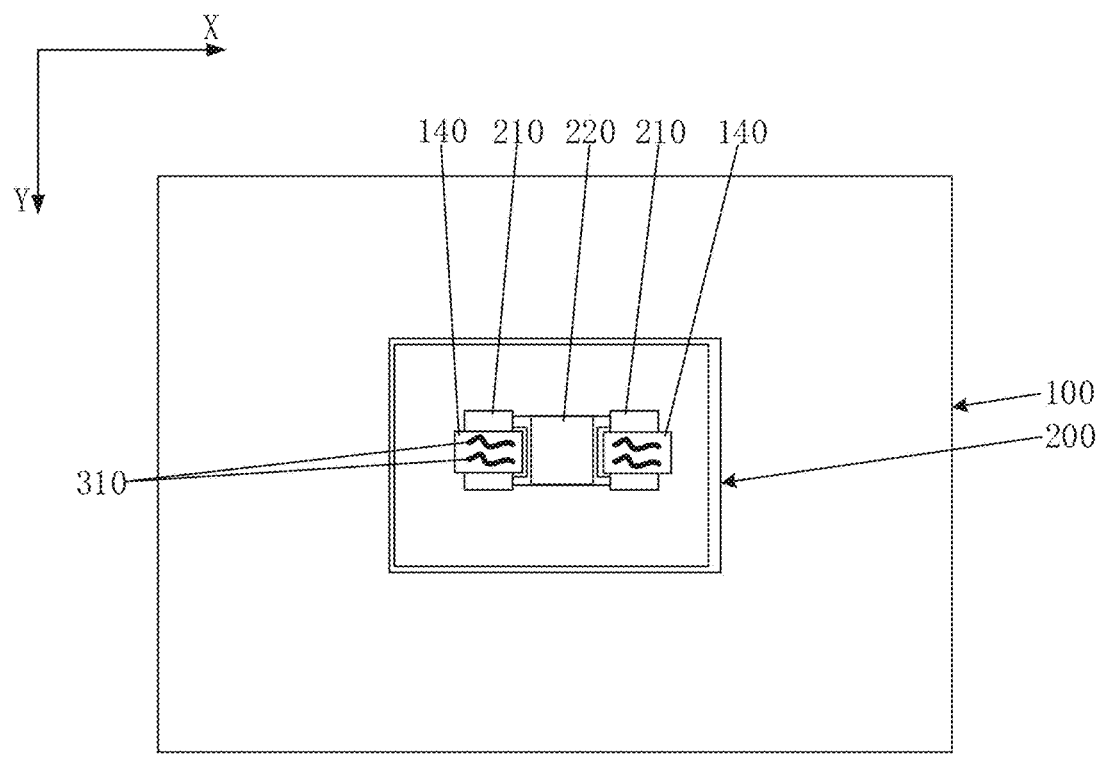
FIG. 3 is a top view of the photovoltaic module according to some embodiments of the present disclosure.

Referring to FIGS. 2 and 3, a plurality of weld seams 310 are formed in a welding region, the welding region refers to a region between the wiring member 140 and the bonding pad 210 in which the laser welding is performed. In this way, welding patterns configured for the welding and fixing between the wiring member 140 and the bonding pad 210 can be dispersedly distributed on a surface of the wiring member 140 and on a surface of the bonding pad 210 which abut against each other, thereby improving the welding stability between the wiring member 140 and the bonding pad 210.

Figure 6:
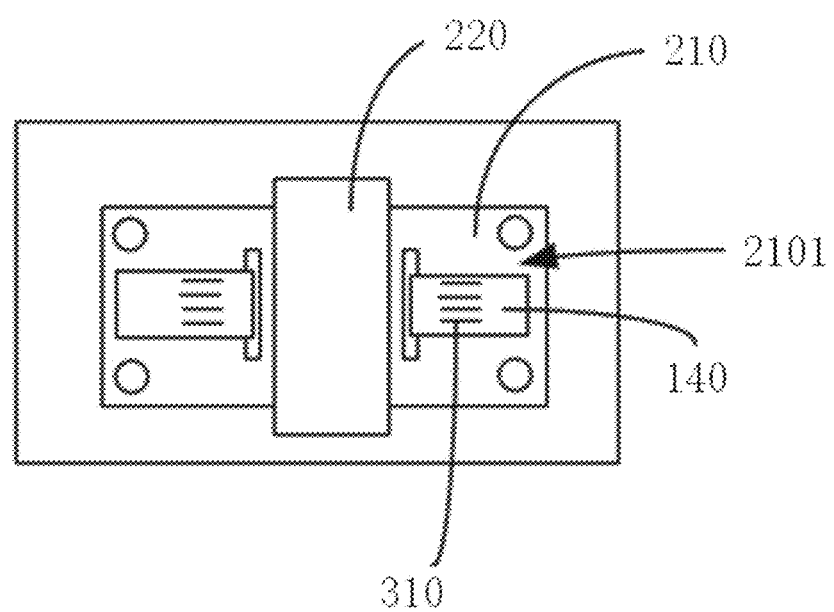
FIG. 6 is a schematic diagram of structure of the wiring member and the bonding pad connected to each other in the junction box of the photovoltaic module according to some embodiments of the present disclosure.
Figure 7:
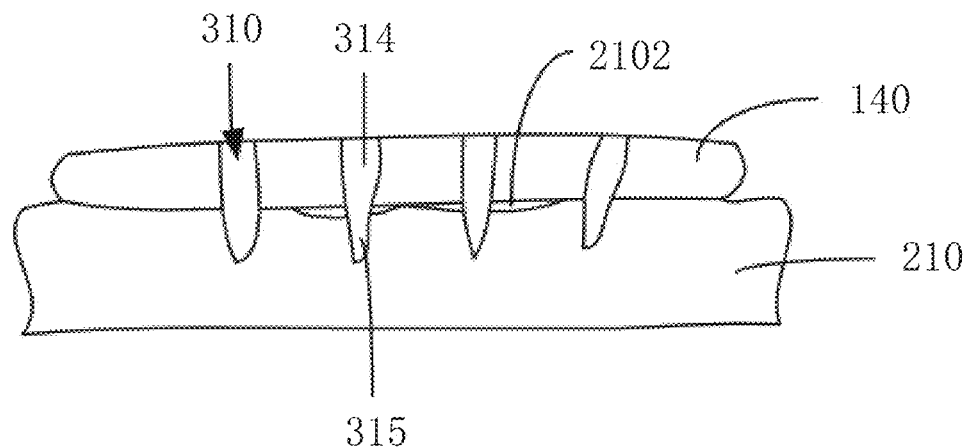
FIG. 7 is a sectional schematic diagram of the wiring member and the bonding pad connected to each other in the junction box of the photovoltaic module according to some embodiments of the present disclosure.

Referring to FIGS. 6 and 7, each of the plurality of weld seams 310 extends from the wiring member 140 away from a surface of the bonding pad 210 and towards an interior of the bonding pad 210. The wiring member 140 and the bonding pad 210 form an integrated structure at the plurality of weld seams 310 through the laser welding, and an extension depth of each of the plurality of weld seams 310 in the bonding pad 210 is not greater than 80% of a thickness of the bonding pad 210.

The plurality of weld seams 310 on the wiring member 140 is formed by laser irradiation. The plurality of weld seams 310 penetrate the wiring member 140 and extend to the interior of the bonding pad 210. The extension depth of each of the plurality of weld seams 310 in the bonding pad 210 is not greater than 80% (greater than 0 and less than or equal to 80%) of the thickness of the bonding pad 210. For example, in practice, the extension depth of each of the plurality of weld seams 310 in the bonding pad 210 may be 80%, 70%, 60%, 50%, 40%, 30%, 20%, 10%, 5% or 3% of the thickness of the bonding pad 210, preferably 15% to 45%.

It should be noted that the extension depth of each of the plurality of weld seams 310 in the bonding pad 210 depends on laser power and laser irradiation duration. In practice, with the increase of the laser power and/or the extension of laser irradiation duration, the extension depth of each of the plurality of weld seams 310 in the bonding pad 210 accordingly increases. When the extension depth of each of the plurality of weld seams 310 in the bonding pad 210 is too large, the laser penetrates the bonding pad 210 and touches the bottom of the junction box 200. When the extension depth of each of the plurality of weld seams 310 in the bonding pad 210 is too small, poor contact may occur between the wiring member 140 and the bonding pad 210. Table 1 below describes the effects corresponding to proportions of the extension depth of each of the plurality of weld seams 310 in the bonding pad 210 as listed above to the thickness of the bonding pad 210 based on the defect rates during the arrangement of the junction box of photovoltaic module.

Table 1 lists the defect rates of photovoltaic module 10 under different proportions of extension depth of a weld seams 310 (In Table 1, the proportions of extension depth are divided into two types. The proportions of extension depth in comparative example 1 and comparative example 2 indicate the proportions of the extension depth of the weld seam 310 in the wiring member 140 to the thickness of the wiring member 140. The proportions of extension depth in comparative example 3, comparative example 4 and examples 1 to 7 indicate the proportions of the extension depth of the weld seam 310 in the bonding pad 210 to the thickness of the bonding pad 210. The defect rates indicate the proportions of defective products emerged during the arrangement of the junction box 200 of photovoltaic module 10. The proportions of poor contact indicate the proportions of products with poor contact between the wiring member 140 and the bonding pad 210 during the arrangement of the junction box 200 of photovoltaic module 10. The proportions of penetration of bonding pad indicate the proportions of products with penetration of the bonding pad during the arrangement of the junction box 200 of photovoltaic module 10).

photovoltaic module 10 is low. When the extension depth of the weld seam 310 in the bonding pad 210 exceeds 80% of thickness of the bonding pad 210 (Comparative example 3 and Comparative example 4), the defect rate of the photovoltaic module 10 is high. When the proportion of the extension depth of the weld seam 310 in the bonding pad 210 to the thickness of the bonding pad 210 ranges from 15% to 45% (Example 3 to Example 6), the yield of the photovoltaic module 10 is relatively high, that is, the proportions of products with poor contact between the wiring member 140 and the bonding pad 210 during the arrangement of the junction box 200 of photovoltaic module 10 are relatively low, and the proportions of products with penetration of the bonding pad 210 are relatively low.

Moreover, the plurality of weld seams 310 may be formed by continuous laser irradiation or pulsed laser irradiation. The irradiation paths of laser form filiform weld seams 310 on the surface of the wiring member 140. The weld seams 310 formed by continuous laser irradiation have no obvious disconnection on the irradiation paths of laser. The weld seams 310 formed by pulsed laser irradiation are in a form of regularly arranged dots on the irradiation paths of laser.

In the photovoltaic module 10 according to some embodiments of the present disclosure, a plurality of weld seams 310 are formed, by laser welding, in a region between the wiring member 140 and the bonding pad 210 of the junction

TABLE 1

|  | Proportions of extension depth | Defect rates | Proportions of poor contact | Proportions of penetration of bonding pad |
|---|---|---|---|---|
| Comparative example 1 | 90% (proportion of the extension depth of a weld seam in the wiring member) | 96% | 96% | 0 |
| Comparative example 2 | 95% (proportion of the extension depth of a weld seam in the wiring member) | 98% | 98% | 0 |
| Comparative example 3 | 85% (proportion of the extension depth of a weld seam in the bonding pad) | 10% | 0 | 10% |
| Comparative example 4 | 90% (proportion of the extension depth of a weld seam in the bonding pad) | 20% | 0 | 20% |
| Example 1 | 1.5% (proportion of the extension depth of a weld seam in the bonding pad) | 8% | 8% | 0 |
| Example 2 | 10% (proportion of the extension depth of a weld seam in the bonding pad) | 2.31% | 2.3% | 0.01% |
| Example 3 | 15% (proportion of the extension depth of a weld seam in the bonding pad) | 2.02% | 2% | 0.02% |
| Example 4 | 30% (proportion of the extension depth of a weld seam in the bonding pad) | 1.05% | 1% | 0.05% |
| Example 5 | 35% (proportion of the extension depth of a weld seam in the bonding pad) | 1.1% | 0.8% | 0.3% |
| Example 6 | 45% (proportion of the extension depth of a weld seam in the bonding pad) | 1.2% | 0.7% | 0.5% |
| Example 7 | 60% (proportion of the extension depth of a weld seam in the bonding pad) | 3.5% | 0.5% | 3% |
| Example 8 | 80% (proportion of the extension depth of a weld seam in the bonding pad) | 5.2% | 0.2% | 5% |

It can be seen in Table 1 that, when the weld seam 310 is only formed in the wiring member 140 (Comparative example 1 and Comparative example 2), the yield of the photovoltaic module 10 is low. When the extension depth of box 200 in which the laser welding is performed. The wiring member 140 and the bonding pad 210 form an integrated structure at the plurality of weld seams 310, and the extension depth of each of the plurality of weld seams 310 in the bonding pad 210 is not greater than 80% of the thickness of the bonding pad 210. Thus, the metal material of the wiring member 140 and the metal material of the bonding pad 210 are melted and integrated under the action of the laser, and no metal tin is needed to implement connection. In this way, an integrated structure with high connection strength can be formed at the connection interface between the wiring member 140 and the bonding pad 210 of the junction box 200, the electrical connection between the wiring member 140 and the bonding pad 210 can be free of influence by external conditions due to filling metal tin at the connection interface between the wiring member 140 and the bonding pad 210, thereby securing the connection reliability of the junction box 200 in the photovoltaic module 10.

FIG. 7 shows a schematic diagram of the sectional structure of the wiring member 140 and the bonding pad 210 connected by laser welding in the junction box 200 according to some embodiments of the present disclosure. It can be seen in FIG. 7 that the bonding pad 210 provided in some embodiments of the present disclosure has no obvious structure of tin storage tank.

In some embodiments, as shown in FIGS. 6 and 7, the bonding pad 210 includes the welding region 2101 in which the wiring member 140 abuts the bonding pad 210, and a plurality of recesses 2102 formed in the welding region 2101. Each of the plurality of recesses 2102 surrounds a respective weld seam 310, and there is a gap between each of the plurality of recesses 2102 and a surface of the wiring member 140 facing to the bonding pad 210.

By forming the plurality of recesses 2102 in the welding region 2101 on the bonding pad 210, filling spaces can be provided for the molten metal material of the wiring member 140, thereby increasing the area of the integrated connection region between the wiring member 140 and the bonding pad 210. In this way, the connection strength between the wiring member 140 and the bonding pad 210 can be further increased. Moreover, accommodation spaces can be provided for the slag generated during welding, so as to prevent the slag from filling at the connection interface of metal material between the wiring member 140 and the bonding pad 210 and affecting the welding strength.

As shown in FIG. 7, in some embodiments, each of the plurality of weld seams 310 includes a first segment 314 formed in the wiring member 140 and a second segment 315 formed in the bonding pad 210, and the first segment 314 and the second segment 315 are interconnected at an interface between the wiring member 140 and the bonding pad 210.

The first segment 314 of a weld seam 310 is formed in the wiring member 140 and penetrates the whole wiring member 140 in a thickness direction. The second segment 315 of the weld seam 310 extends from a surface of the bonding pad 210 facing to the wiring member 140 towards the interior of the bonding pad 210, and interconnects with the first segment of the weld seam 310 at the interface between the wiring member 140 and the bonding pad 210.

In some embodiments, a width of the first segment 314 is constant in a thickness direction of the wiring member 140, or the width of the first segment 314 decreases in the direction directing from the wiring member 140 to the bonding pad 210.

That is to say, the width of the first segment 314 of the weld seam 310 may be constant at any part inside the wiring member 140, or the width of the first segment 314 decrease inside the wiring member 140 in the direction directing to the bonding pad 210.

It is understood that the width of the weld seam 310 may be controlled by adjusting the laser power and laser irradiation duration. When the laser power is high and/or the laser irradiation duration is long, the laser will not be obviously attenuated during melting through the wiring member 140, thereby forming a plurality of weld seams 310 with constant widths in the wiring member 140, i.e. forming elongated rectangular weld seams 310 in the welding section. When the laser power is low and/or the laser irradiation duration is short, the laser will be attenuated to a certain extent during melting through the wiring member 140, thereby forming a plurality of weld seams 310 with decreasing widths in the wiring member 140, i.e. forming elongated tapered weld seams 310 in the welding section.

In practice, the connection strength between the wiring member 140 and the bonding pad 210 can be controlled by forming different types of weld seams 310. In order to provide high connection strength between the wiring member 140 and the bonding pad 210, weld seams 310 with constant widths may be formed in the wiring member 140 to ensure that the weld seams 310 at the connection interface between the wiring member 140 and the bonding pad 210 have sufficient widths.

In some embodiments, a width of the second segment 315 is constant in a thickness direction of the bonding pad 210, or the width of the second segment 315 decreases in the direction directing from the wiring member 140 to the bonding pad 210.

Similar to the first segment 314 of the weld seam 310, the width of the second segment 315 of the weld seam 310 may be constant at any part inside the bonding pad 210, or the width of the second segment 315 decrease inside the bonding pad 210 in the direction away from the wiring member 140. Similarly, the connection strength between the wiring member 140 and the bonding pad 210 can be controlled by forming different types of weld seams 310. When the width of the second segment 315 of the weld seam 310 is constant at any part inside the bonding pad 210, the weld seam 310 formed inside the bonding pad 210 is uniform, and stress changes at any part of the weld seam 310 are relatively uniform, so that the weld seam 310 can be not easily damaged due to changes in external conditions. When the width of the second segment 315 of the weld seam 310 decrease inside the bonding pad 210 in the direction away from the wiring member 140, the extent of changes in the internal structure of the bonding pad 210 can be reduced, so that the original internal structure of the bonding pad 210 can be not damaged as much as possible. In this way, the structural strength of the original structure of the bonding pad 210 can be secured.

In some embodiments, a width at the interconnection between the first segment 314 and the second segment 315 is 50% to 120% of a width of the first segment 314 at a surface of the wiring member 140 away from the bonding pad 210.

For example, in practice, the width at the interconnection between the first segment 314 and the second segment 315 is 50%, 60%, 70%, 80%, 90%, 100%, 110% or 120%, preferably from 65% to 85%, of the width of the first segment 314 at the surface of the wiring member 140 away from the bonding pad 210.

It is noted that when the wiring member 140 closely abuts the bonding pad 210, there will be no obvious molten metal filling at the connection interface between the wiring member 140 and the bonding pad 210, so that the width at the interconnection between the first segment 314 and the second segment 315 is not greater than the width of the first segment 314 at the surface of the wiring member 140 away from the bonding pad 210. When the bonding pad 210 includes the plurality of recesses 2102, the molten metal during laser welding will fill in the plurality of recesses 2102, so that the width at the interconnection between the first segment 314 and the second segment 315 is increased compared with the width of the first segment 314 at the surface of the wiring member 140 away from the bonding pad 210. In some embodiments, when the width of the first segment 314 at the surface of the wiring member 140 away from the bonding pad 210 is 0.3 mm to 0.4 mm, the width at the interconnection between the first segment 314 and the second segment 315 may be 0.25 mm to 0.45 mm.

By controlling the width at the interconnection between the first segment 314 and the second segment 315 of the weld seam 310, there can be sufficient connection strength at the connection interface between the wiring member 140 and the bonding pad 210. In this way, connection reliability between the wiring member 140 and the bonding pad 210 can be secured.

In some embodiments, at least one weld seam 310 forms a filiform shape on a surface of the wiring member 140.

That is to say, during the welding, the path of the laser on the wiring member 140 is in a form of a straight line or a curve. Moreover, there may be one or more paths of the laser on the wiring member 140.

By controlling the shape formed by the path of the laser on the wiring member 140, the weld seams 310 can be formed in most regions on the surface of the wiring member 140, and a fixed connection can be formed between the most regions on the wiring member 140 and the bonding pad 210.

In practice, the shape formed by the weld seams 310 on the surface of the wiring member 140 may include straight lines, wavy lines, S shaped lines, or reciprocating spiral lines. The starting position of the weld seams 310 can be close to, far away from or coincident with the ending position. For example, when the weld seams 310 form a shape of straight lines on the surface of wiring member 140, the starting position of the weld seams 310 is far away from the ending position. When the weld seams 310 form a shape of open circles on the surface of the wiring member 140, the starting position of the weld seams 310 is close to the ending position. When the weld seams 310 form a closed shape such as squares, circulars or the like on the surface of the wiring member 140, the starting position of the weld seams 310 coincides with the ending position.

In some embodiments, there is a plurality of weld seams 310 distributed in a width direction of the wiring member 140. A length of each of the plurality of weld seams 310 is not less than 3 mm and not greater than 5 mm, and a width of each of the plurality of weld seams 310 is not less than 0.35 mm and not greater than 0.45 mm.

For example, in practice, the length of a weld seam 310 may be 3 mm, 4 mm or 5 mm, and the width of the weld seam 310 may be 0.35 mm, 0.40 mm or 0.45 mm. The width of the wiring member 140 may be 4 mm to 7 mm.

By sequentially distributing the plurality of weld seams 310 in the width direction of the wiring member 140, the plurality of weld seams 310 can extend in the length direction of the wiring member 140. In this way, the wiring member 140 and the bonding pad 210 can be well fixed along the length direction of the wiring member 140.

In practice, depending on the width of the wiring member 140, the number of the plurality of weld seams 310 may be two, three, four or five.

In some embodiments, a distance between adjacent weld seams 310 is not less than 0.4 mm and not greater than 0.6 mm.

For example, in practice, the distance between adjacent weld seams 310 may be 0.4 mm, 0.5 mm, or 0.6 mm.

By controlling the distance between adjacent weld seams 310, interference between weld seams 310 can be avoided, and a good fixing effect can be achieved in the width direction of the wiring member 140.

In some embodiments, the starting positions of the plurality of weld seams 310 are distributed in a straight line on the surface of the wiring member 140, and the ending positions of the plurality of weld seams 310 are distributed in another straight line on the surface of the wiring member 140. The straight line on which the starting positions of the plurality of weld seams 310 are positioned are parallel to that on which the ending positions of the plurality of weld seams 310 are positioned.

In other words, the plurality of weld seams 310 are distributed in parallel on the surface of the wiring member 140, such that the weld seams 310 formed on the surface of the wiring member 140 can be uniformly distributed. In this way, the welding path of the laser head in the actual welding process can be easily controlled, which is conducive to the smooth performance of the welding process.

In some embodiments, a region in which the wiring member 140 abuts the bonding pad 210 has a first area, the welding region has a second area, and the second area is 30% to 60% of the first area.

With the second area being 30% to 60% of the first area, a sufficient welding area between the wiring member 140 and the bonding pad 210 can be ensured, and it can be ensured that the welding area between the wiring member 140 and the bonding pad 210 would not be too large, thereby ensuring that the wiring member 140 would not fracture when welding the wiring member 140. In this way, a high drawing force between the laser welded wiring member 140 and the bonding pad 210 can be ensured, thereby improving the welding stability between the welded wiring member 140 and the bonding pad 210.

In some embodiments, the first area ranges from 13 $mm^2$ to 15 $mm^2$. It is noted that the present disclosure does not limit the value of the second area, for example, the second area ranges from 4 $mm^2$ to 7 $mm^2$. In this way, it can be ensured that the second area is 30% to 60% of the first area.

For example, the first area is valued by 13 $mm^2$ and the second area is valued by 4 $mm^2$. In another example, the first area is valued by 14 $mm^2$ and the second area is valued by 6 $mm^2$.

In some embodiments, the second area is 40% to 50% of the first area. In this way, a sufficient welding area between the wiring member 140 and the bonding pad 210 can be further ensured, and it can be further ensured that the welding area between the wiring member 140 and the bonding pad 210 would not be too large, thereby ensuring that the wiring member 140 would not fracture when welding the wiring member 140. In this way, a high drawing force between the laser welded wiring member 140 and the bonding pad 210 can be further ensured, thereby further improving the welding stability between the welded wiring member 140 and the bonding pad 210.

In an example, the second area is 40% of the first area. In this way, the best welding stability between the welded wiring member 140 and the bonding pad 210 can be obtained. In another example, the second area is 45% of the first area.

It is noted that the present disclosure does not limit the shape of the specific welding pattern configured to fix the wiring member 140 to the bonding pad 210, as long as the second area is 30% to 60% of the first area.

In some embodiments, a surface of the wiring member 140 and a surface of the bonding pad 210 which abut against each other are both flat surfaces.

In some embodiments, each weld seam 310 has two ends formed in a first direction (i.e. the X direction as shown in FIGS. 2 and 3), and the plurality of weld seams 310 are distributed in sequence in a second direction (i.e. the Y direction as shown in FIGS. 2 and 3), and the first direction is perpendicular to the second direction. In this way, welding patterns configured for the welding and fixing between the wiring member 140 and the bonding pad 210 can be further dispersedly distributed on a surface of the wiring member 140 and on a surface of the bonding pad 210 which abut against each other, thereby further improving the welding stability between the wiring member 140 and the bonding pad 210.

In some embodiments, the plurality of weld seams 310 form a shape of straight lines, polygonal lines or curves on a surface of the wiring member away from the plurality of solar cells. When the shape formed by the plurality of weld seams 310 is straight lines, the number of the plurality of weld seams 310 is not less than 3. In this way, in addition to that the second area being 30% to 60% of the first area can be ensured, the widths of the plurality of weld seams 310 can be prevented from being too large, which is conducive to the laser welding.

Figure 4:
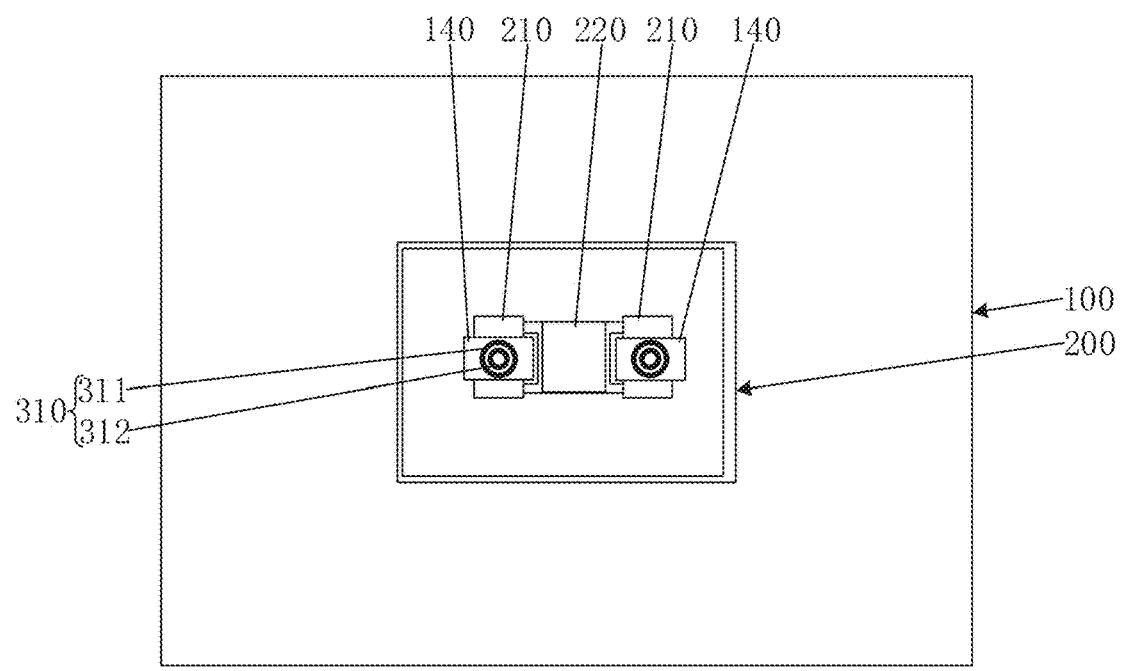
FIG. 4 is a top view of the photovoltaic module according to some embodiments of the present disclosure.
Figure 5:
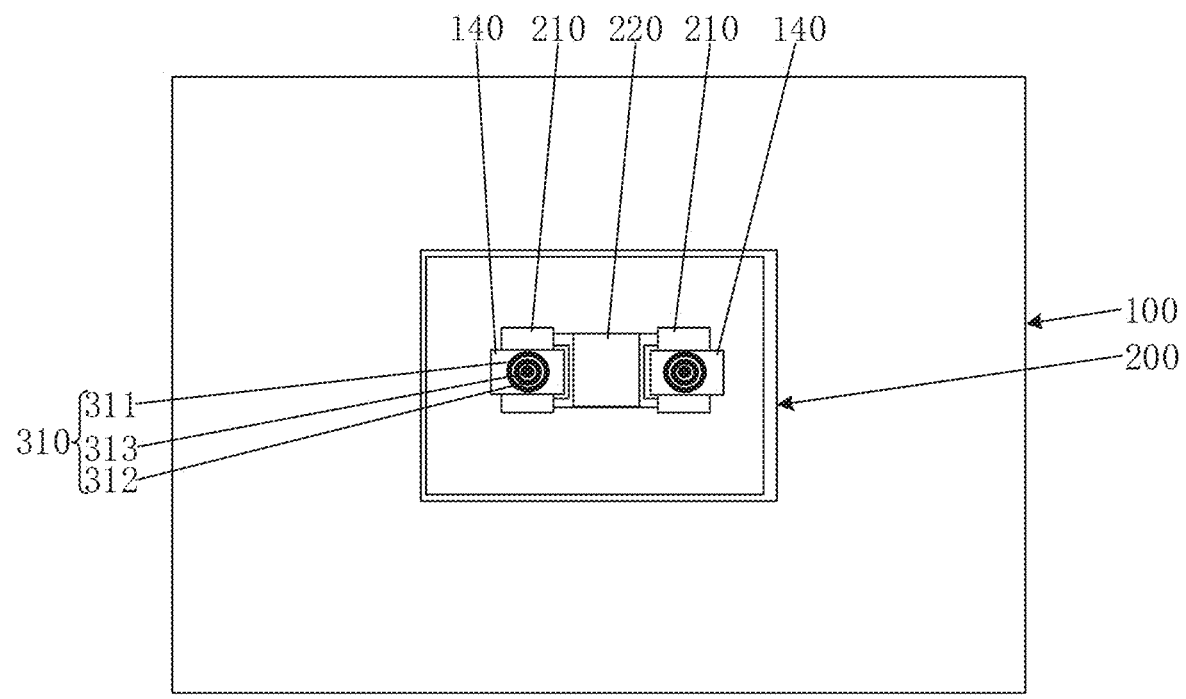
FIG. 5 is a top view of the photovoltaic module according to some embodiments of the present disclosure.

Referring to FIGS. 4 and 5, in some embodiments, the plurality of weld seams 310 include a first weld seam 311 and a second weld seam 312. The first weld seam 311 forms a closed pattern, and the second weld seam 312 is formed in the closed pattern formed by the first weld seam 311. In this way, welding patterns configured for the welding and fixing between the wiring member 140 and the bonding pad 210 also can be dispersedly distributed on a surface of the wiring member 140 and on a surface of the bonding pad 210 which abut against each other, thereby improving the welding stability between the wiring member 140 and the bonding pad 210.

It is noted that the present disclosure does not limit the shape of the closed pattern formed by the first weld seam 311. In an example, the shape of the closed pattern formed by the first weld seam 311 is a circle. Alternatively, the shape of the closed pattern formed by the first weld seam 311 is a rectangle.

In some embodiments, the first weld seam 311 forms a shape identical to that formed by the second weld seam 312 on a surface of the wiring member away from the plurality of solar cells. In this way, welding patterns configured for the welding and fixing between the wiring member 140 and the bonding pad 210 can further be dispersedly distributed on a surface of the wiring member 140 and on a surface of the bonding pad 210 which abut against each other, thereby further improving the welding stability between the wiring member 140 and the bonding pad 210. Moreover, it is conducive to forming the welding patterns by laser.

It is noted that in some embodiments, the first weld seam 311 may form a shape different from that formed by the second weld seam 312. In this case, the shape formed by the second weld seam 312 may be a straight line, a polygonal line or a curve.

Referring to FIG. 5, in some embodiments, the plurality of weld seams 310 further include a third weld seam 313. The second weld seam 312 forms a closed pattern, and the third weld seam 313 is formed in the closed pattern formed by the second weld seam 312. In this way, in addition to that the second area being 30% to 60% of the first area can be ensured, the widths of the plurality of weld seams 310 can be prevented from being too large, which is conducive to the laser welding.

It is noted that the third weld seam 313 may form a shape identical to that formed by the second weld seam 312 and/or that formed by the first weld seam 311 on the surface of the wiring member away from the plurality of solar cells. Alternatively, the third weld seam 313 may form a shape different from that formed by the second weld seam 312 and/or that formed by the first weld seam 311. In this case, the shape formed by the third weld seam 313 may be a straight line, a polygonal line or a curve.

Referring to FIGS. 1 to 5, in some embodiments, the photovoltaic laminate includes two wiring members 140, and the junction box includes two bonding pads 210, and the two wiring members 140 are arranged to be in one to one correspondence to the two bonding pads 210. The junction box 200 may further include a diode 220, one end of the diode 220 is electrically connected to one of the two bonding pads 210, and the other end of the diode 220 is electrically connected to the other bonding pad 210. In this way, the diode 220 can be used as a protective element when the light receiving surface of the photovoltaic laminate 100 is shaded.

In some embodiments, the wiring member 140 and the bonding pad 210 are made of the same material. Thus, upon the wiring member 140 being fixed to the bonding pad 210 by laser welding, the expansion volume generated by the heating/contraction volume generated by the cooling of the wiring member 140 is the same as the expansion volume generated by the heating/contraction volume generated by the cooling of the bonding pad 210. In this way, the delamination between the wiring member 140 and the bonding pad 210 can be prevented. In an example, both the wiring member 140 and the bonding pad 210 are made of copper.

In some embodiments, a positioning region is defined on the bonding pad, and a facing region in which the wiring member abuts against the bonding pad is defined on the bonding pad. The positioning region has an area greater than an area of the facing region, and the facing region is defined within the positioning region.

In this way, before performing the laser welding on the wiring member 140 and the bonding pad 210, during alignment of a part of the surface of the wiring member 140 to the facing region 112, even if the part of the surface of the wiring member 140 is not completely aligned with the facing region 112 due to errors, it can be ensured that the part of the surface of the wiring member 140 is aligned with the positioning region 111 as much as possible, so as to ensure that the wiring member 140 can be fixed with the bonding pad 210 by laser welding.

It is noted that in some embodiments, the positioning region 111 occupies a part of the surface of the bonding pad 210 facing to the wiring member. In some other embodiments, the positioning region 111 occupies a whole surface of the bonding pad 210 facing to the wiring member.

Figure 8:
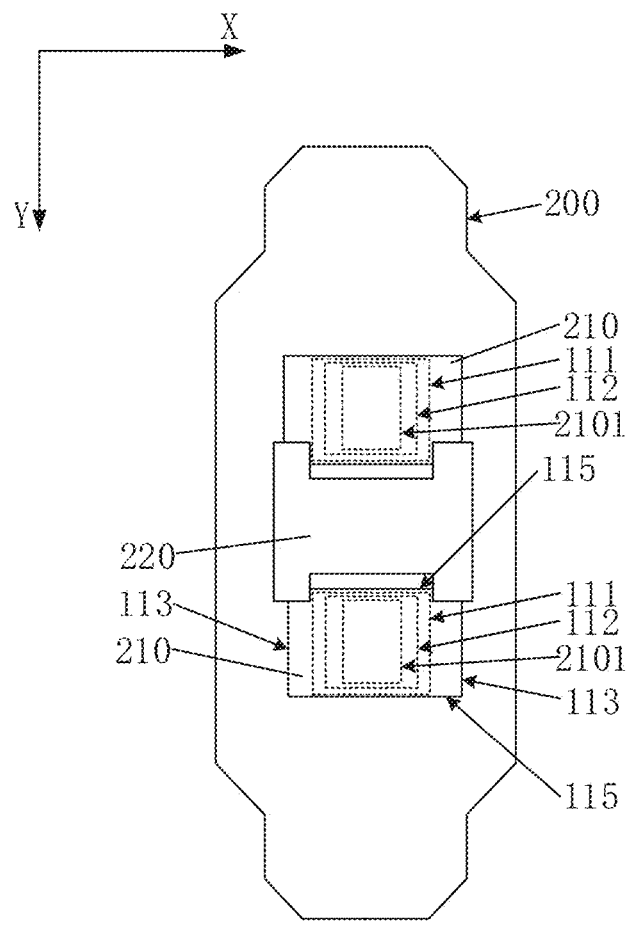
FIG. 8 is a structural schematic diagram of the junction box according to some embodiments of the present disclosure.
Figure 10:
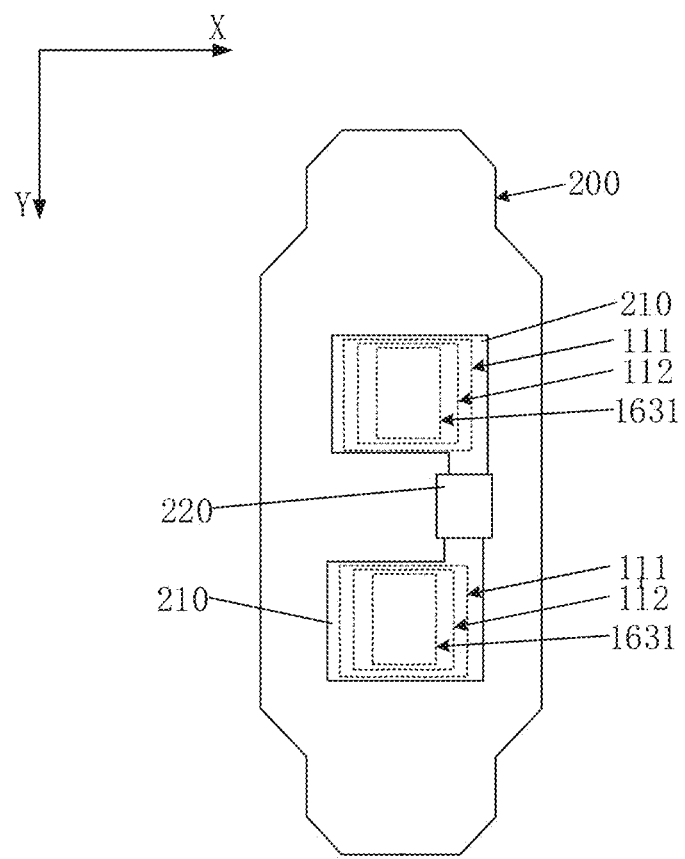
FIG. 10 is a structural schematic diagram of the junction box according to some embodiments of the present disclosure.
Figure 11:
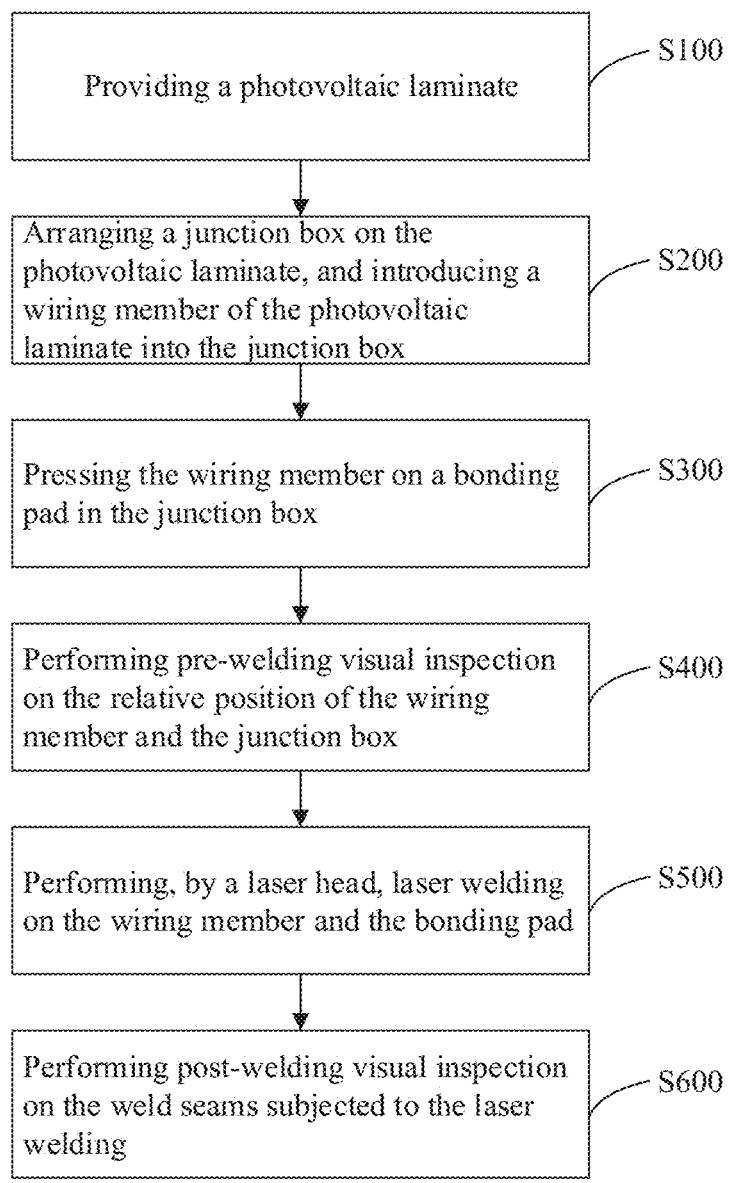
FIG. 11 is a flow chart of producing process for the photovoltaic module according to some embodiments of the present disclosure.

In some embodiments, the positioning region 111 has two first boundaries 113 opposite to each other in a first direction (i.e. the X direction as shown in FIGS. 8 and 10), the facing region 112 is defined between the two first boundaries 113, and there is a spacing between the facing region and either one of the two first boundaries 113.

In this way, during alignment of a part of the surface of the wiring member 140 to the facing region 112, whether the wiring member 140 is offset in the first direction or in the opposite direction of the first direction, it can be ensured that the part of the surface of the wiring member 140 is aligned with the positioning area 111, so as to ensure that the wiring member 140 can be fixed with the bonding pad 210 by laser welding.

It is noted that the present disclosure does not limit the size of the facing region 112 in the first direction, and does not limit the spacing between the facing region 112 and either one of the two first boundaries 113.

In some embodiments, the size of the facing region 112 in the first direction ranges from 3 mm to 5 mm, and the spacing between the facing region 112 and either one of the two first boundaries 113 is not less than 2 mm. In an example, the size of the facing region 112 in the first direction is 4 mm, and the spacing between the facing region 112 and either one of the two first boundaries 113 is 2 mm.

It is noted that the size of the facing region 112 in the first direction may be the same as a size of the wiring member 140 in the first direction. Herein, the first direction may be the width direction of the wiring member 140.

In some embodiments, the welding region 2101 occupies a part of the facing region 112. The welding region 2101 is configured to abut against and be fixed, by welding, to a part of the wiring member 140 extending in a second direction (i.e. the Y direction as shown in FIGS. 8 and 10), and the first direction is perpendicular to the second direction. The positioning region 111 has two second boundaries 115 opposite to each other in the second direction. The welding region 2101 is defined between the two second boundaries 115, and there is a spacing between the welding region and either one of the two second boundaries 115.

In this way, during the fixture, by laser welding, of a part of the surface of the wiring member 140 to the welding region 2101 of the bonding pad 210, whether the wiring member 140 is offset in the second direction or in the opposite direction of the second direction, it can be ensured that the part of the surface of the wiring member 140 is aligned with the positioning area 111, so as to ensure that the wiring member 140 can be fixed with the positioning area 111 of the bonding pad 210 by laser welding.

It is noted that the present disclosure does not limit the size of the welding region 2101 in the second direction, and does not limit the spacing between the welding region 2101 and either one of the two second boundaries 115.

In some embodiments, the size of the welding region 2101 in the second direction ranges from 3 mm to 5 mm, and the spacing between the welding region 2101 and either one of the two second boundaries 115 is not less than 2 mm. In an example, the size of the welding region 2101 in the first direction is 4 mm, and the spacing between the welding region 2101 and either one of the two second boundaries 115 is 2 mm.

It is noted that the second direction may be a length direction of the part of the wiring member 140 which abuts against and is fixed, by welding, to the welding region 2101.

Figure 9:
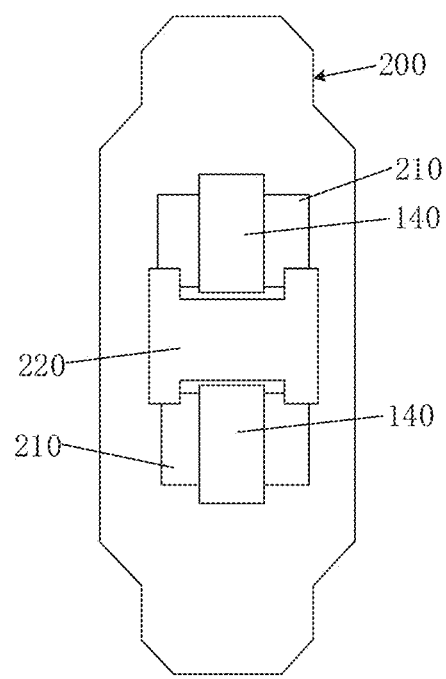
FIG. 9 is a structural schematic diagram of the junction box connected with the wiring member according to some embodiments of the present disclosure.

In some embodiments, the two bonding pads 210 are arranged on either sides of the diode 220. In this case, the two bonding pads 210 may have the same shape and size (as shown in FIGS. 8 and 9). Alternatively, the two bonding pads 210 may have different shape and size, the present disclosure does not limit this.

In some embodiments, the diode 220 is arranged between the two bonding pads 210, and the diode 220 and the two bonding pads 210 form a shape of U (as shown in FIG. 10).

Embodiments of the present disclosure further provide a method for producing a photovoltaic module. The method includes operations as follows.

Operation 1: providing a photovoltaic laminate including a plurality of solar cells, at least one solder strip, a rear plate and a wiring member. The plurality of solar cells are electrically connected by the at least one solder strip to form at least one cell string stacked over the rear plate, and the at least one solder strip is electrically connected with the wiring member. A plurality of cell strings are connected by the wiring member to form at least one cell string set. The series connection of the plurality of cell strings may be carried out by automatic series welding machine.

Operation 2: providing a junction box fixed and connected to the rear plate on a side of the rear plate away from the plurality of solar cells, and the junction box includes a bonding pad. The junction box may be fixed on the rear plate by adhesive.

Operation 3: passing the wiring member through an opening defined on the rear plate, so that a part of the wiring member emerges from the surface of the rear plate of the photovoltaic laminate. The part of the wiring member emerged from the rear plate is led into the junction box, and this part of the wiring member is bent. Upon the wiring member being led into the junction box, the bent part of the wiring member abuts against the bonding pad in the junction box.

The wiring member may be automatically pressed onto the bonding pad by an indenter.

Operation 4: performing, by a laser head, laser welding on the abutting portions of the wiring member and of the bonding pad, to connect the wiring member with the bonding pad. With the laser welding, a plurality of weld seams are formed in a welding region, the welding region refers to a region between the wiring member and the bonding pad in which the laser welding is performed. The plurality of weld seams are configure to connect the wiring member and the bonding pad to form an integrated structure. Each of the plurality of weld seams extends from the wiring member towards an interior of the bonding pad and away from the surface of the bonding pad facing to the wiring member. An extension depth of each of the plurality of weld seams in the bonding pad is not greater than 80% of a thickness of the bonding pad.

In some embodiments, the laser power emitted by the laser head is greater than or equal to 550 W and less than or equal to 750 W.

For example, in practice, the laser power emitted by the laser head may be 550 W, 580 W, 600 W, 620 W, 640 W, 660 W, 680 W, 700 W, 720 W or 750 W.

With the increase of radiation power of the laser head, the depths of the weld seams formed in the connection structure between the wiring member and the bonding pad increases, and the weld seams extending to the interior of the bonding pad is more and more close to the bottom of the junction box. By keeping the laser power emitted by the laser head within the range of 550 W to 750 W, the weld seams can have a proper extension depth in the bonding pad, so as to ensure a good fixing effect and a good current transmission effect between the wiring member and the bonding pad.

In some embodiments, the welding speed of the laser head is greater than or equal to 60 mm/s and less than or equal to 100 mm/s.

For example, in practice, the welding speed of the laser head may be 60 mm/s, 70 mm/s, 80 mm/s, 90 mm/s or 100 mm/s.

With the increase of the welding speed of the laser head, the widths of the weld seams formed on the wiring member decrease. When the welding speed is too fast, the connection strength at a region in which the wiring member abuts against the bonding pad may be insufficient. When the welding speed is too slow, some parts of the bonding pad may be melted and penetrated. Thus, by controlling the welding speed of the laser head, poor quality of the formed weld seams due to too fast welding speed of the laser head can be prevented, and penetration of the bonding pad in the junction box due to too slow welding speed of the laser head also can be prevented.

Moreover, with the increase of the width of the radiation area by laser emitted by the laser head on surface of the wiring member, the widths of the weld seams formed on the wiring member also increase. Since the widths of the weld seams can reflect the welding quality to a certain extent, in order to make the welding quality of the connection structure between the wiring member and the bonding pad in the photovoltaic module meet the requirements, in practice, the width of the radiation area by laser emitted by the laser head on surface of the wiring member may be controlled, so as to ensure the welding quality between the wiring member and the bonding pad. In some embodiments, when the widths of the weld seams on the wiring member is greater than or equal to 0.3 mm and less than or equal to 0.4 mm, it can be considered that the welding quality meets the requirements. Therefore, the width of the irradiation area by the laser emitted from the laser head on surface of the wiring member may be controlled to be within the range of 0.3 mm to 0.4 mm.

Embodiments of the present disclosure further provide another method for producing a photovoltaic module, to address the problem that the detection methods in the related art cannot meet the production requirements of photovoltaic modules any longer.

In the related art, during the welding between the wiring member and the bonding pad, it is necessary to confirm the positions of the wiring member and the junction box with human eyes to ensure the welding accuracy between the wiring member and the bonding pad in the junction box. Moreover, after welding, it is also necessary to inspect whether the welding results meet the expected requirements with human eyes. Due to the low detection accuracy of the human eyes, it is likely to produce defective products such as deviation welding, wrong welding or the like during the welding process. Furthermore, after welding, due to the detection with human eyes is likely to lead to careless omissions, the products with poor welding may flow into the next process.

Aiming at this, the method for producing a photovoltaic module according to some embodiments of the present disclosure includes operations of performing visual inspection on the positions before welding and the weld seams after welding. The positions of the wiring member and the junction box are determined by a visual inspection system to determine the welding position on the wiring member in the actual welding process. The visual inspection system is used to detect the weld seams formed by welding, and judge whether the weld seams meet the expected requirements according to the inspection results.

The method for producing a photovoltaic module includes operations as follows.

S100: providing a photovoltaic laminate.

The photovoltaic laminate includes a cell string set including a plurality of cell strings, the plurality of cell strings are connected through a wiring member. Each cell string is formed by a plurality of solar cells connected in series through a solder strip. By connecting the plurality of solar cells in series into a cell string and connecting the plurality of cell strings in series or parallel to form a cell string set, the voltage and power of the photovoltaic module can be improved, so as to ensure that the power generation efficiency of the photovoltaic module can meet expected requirements.

S200: arranging a junction box on the photovoltaic laminate, and introducing a wiring member of the photovoltaic laminate into the junction box.

The photovoltaic module is electrically connected with the external electric control device by the junction box. The junction box further includes a diode and a circuit formed by cables. The diode can protect the cell string set of the photovoltaic module, and the conductive terminal of the diode is connected with the wiring member to connect the cell string set of the photovoltaic module to the external electric control device.

S300: pressing the wiring member on a bonding pad in the junction box.

The bonding pad in the junction box can provide a fixing location for the wiring member. The bonding pad may be formed by the conductive terminal of the diode, that is, the conductive terminal of the diode is extended into a plane shape with a certain area, so as to realize the connection with the wiring member. Alternatively, the bonding pad may be an individual bonding pad component, that is, the individual bonding pad component is fixed in the junction box through fasteners such as rivets, and the individual bonding pad component is connected with the conductive terminal of the diode. Pressing the wiring member on the bonding pad in the junction box is conducive to subsequent laser welding.

S400: performing pre-welding visual inspection on the relative position of the wiring member and the junction box.

Visual inspection may be realized by a CCD machine vision system. The CCD machine vision system includes a CCD camera and a control center. The CCD camera can move under the control of the control center to take pictures of the object to be inspected, and the photographic results may be recognized after being transmitted to the control center. The CCD machine vision system includes positioning function, measurement function and recognition function, that is, the CCD machine vision system can automatically locate the position features on the appearance of the object to be inspected, automatically measure the appearance size of the object to be inspected, and recognize the color, graphics or characters on the object to be inspected. Moreover, the CCD machine vision system can establish a database model to judge whether the object to be inspected is qualified by comparing the image of the object to be inspected with the image in the database.

By detecting the relative position of the wiring member and the junction box, the welding area of the wiring member and the starting and ending positions of the welding can be determined before welding.

S500: performing, by a laser head, laser welding on the wiring member and the bonding pad.

The laser head can realize welding by emitting laser of a specific power. The laser emitted by the laser head melts the wiring member and the bonding pad when arriving at a surface of the wiring member. With the movement of the laser, weld seams are formed in the path of the laser, and the wiring member is integrated with the bonding pad at the weld seams.

S600: performing post-welding visual inspection on the weld seams subjected to the laser welding.

Through visual inspection on the weld seams subjected to the laser welding, it can be judged whether the weld seams formed by welding meets the requirements.

In the method for producing a photovoltaic module according to some embodiments of the present disclosure, laser welding is used to replace the traditional thermocompression bonding. During the laser welding, a portion by which the wiring member and the bonding pad are in direct contact with each other is formed at the interface between the wiring member and the bonding pad, which can replace the metal tin fused at the interface between the wiring member and the bonding pad in traditional thermocompression bonding. Since it is unnecessary to fix the wiring member to the bonding pad with solder paste, the connection reliability between the wiring member and the bonding pad will not be affected by the cold joint due to solder paste shortage. Moreover, upon the wiring member being fixed with the bonding pad, the metal material of the wiring member and the metal material of the bonding pad are integrated. In this way, the connection strength between the wiring member and the bonding pad can be secured, and connection failure of the diode with the junction box during production of the photovoltaic module can be prevented.

Moreover, by visual inspection on the relative position of the wiring member and the bonding pad before welding, the welding locations of the wiring member on the bonding pad can be determined according to the inspection results, so as to achieve accurate control of the welding between the wiring member and the bonding pad. In this way, welding can be ensured to be carried out within the predetermined region, and faults such as deviation welding, wrong welding or the like can be prevented. Furthermore, visual inspection can be carried out on the weld seams after welding to determine whether the weld seams meet the requirements according to the inspection results, so as to screen out the unqualified welding products in time.

Figure 12:
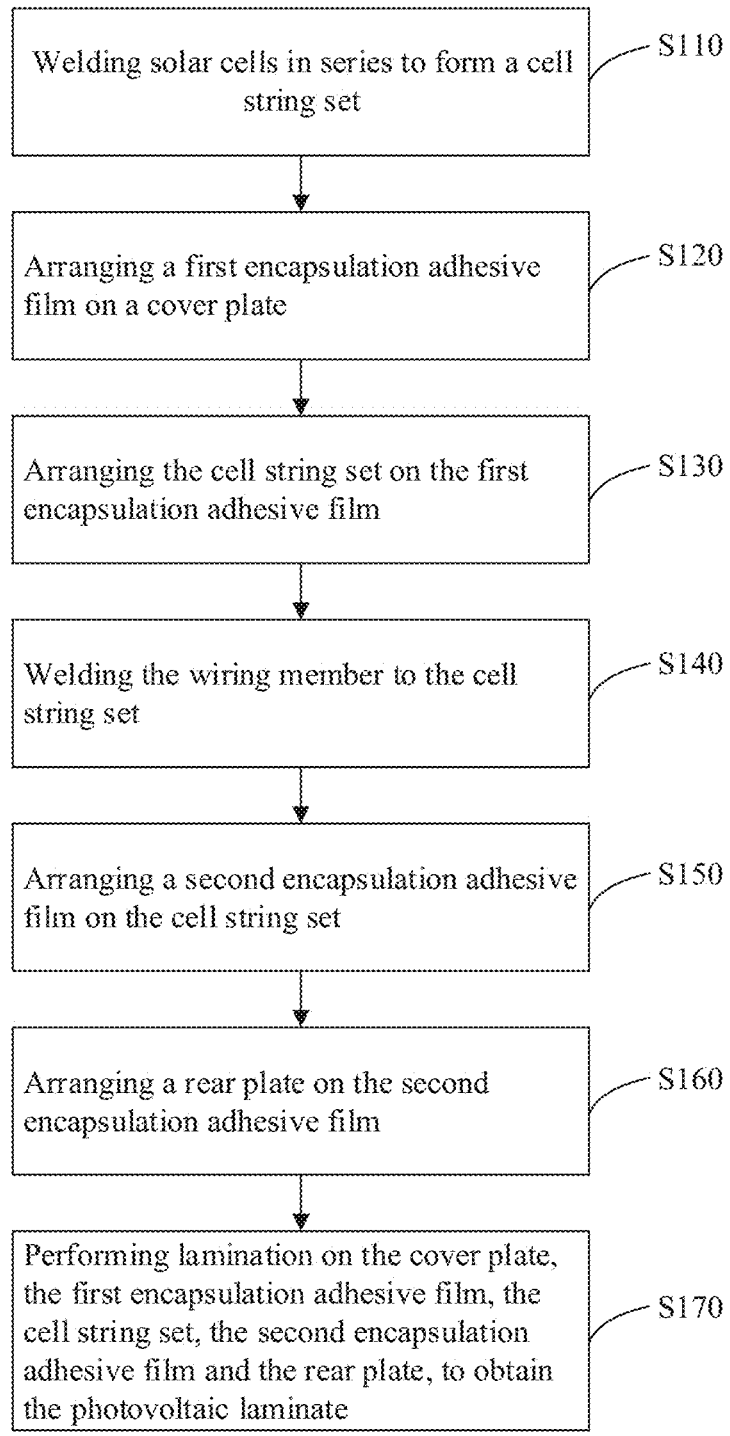
FIG. 12 is a flow chart of steps for producing the photovoltaic laminate according to some embodiments of the present disclosure.

In some embodiments, as shown in FIG. 12, the operation S100 of providing the photovoltaic laminate includes operations as follows.

S110: welding solar cells in series to form a cell string set.

A solar cell generally includes a substrate, a PN junction and a passivation structure formed on the substrate, and a grid electrode formed on a surface of the solar cell. The substrate is generally a silicon substrate, and the PN junction formed on the silicon substrate generates current under the action of light. The grid line electrode includes a fine grid line used to output the current generated by the PN junction. The solar cell may be automatically welded by an automatic series welding machine. During the series welding, a plurality of solar cells are connected through a solder strip to form a cell string, and then a plurality of cell strings are connected through a wiring member to form a cell string set.

S120: arranging a first encapsulation adhesive film on a cover plate.

The cover plate is a protective plate arranged on the front side of the cell string set and configured to protect the cell string set. Moreover, the cover plate may be made of glass to provide light transmission on the front side of the cell string set. The first encapsulation adhesive film may be EVA adhesive film, POE adhesive film or PVB adhesive film, which is used for adhesion on the front side of the cell string set.

S130: arranging the cell string set on the first encapsulation adhesive film.

S140: welding the wiring member to the cell string set.

The welding is performed with the wiring member and the solder strip of the cell string being kept in contact. In practice, the wiring member may be kept to be perpendicular to the solder strip of the cell string. In this way, a transfer path for the photo-generated current generated by the cell string can be shortened, thereby reducing the current loss.

S150: arranging a second encapsulation adhesive film on the cell string set.

The second encapsulation adhesive film is arranged on a rear side of the cell string set. The second encapsulation adhesive film may be EVA adhesive film, POE adhesive film or PVB adhesive film, which is used for adhesion on the rear side of the cell string set.

S160: arranging a rear plate on the second encapsulation adhesive film.

The rear plate is configured to protect the cell string set on the rear side of the cell string set. Similarly, the cover plate may be made of glass to provide light transmission on the rear side of the cell string set. A leading hole may be defined on the rear plate, and the wiring member may pass through the leading hole on the rear plate, such that a part of the wiring member emerges from the rear plate. Generally, one to three sets of leading holes are defined on the rear plate, and each set of leading holes corresponds to a pair of wiring members.

S170: performing lamination on the cover plate, the first encapsulation adhesive film, the cell string set, the second encapsulation adhesive film and the rear plate, to obtain the photovoltaic laminate.

The lamination may be carried out in a laminating chamber of a laminating machine. Before laminating, the surfaces of the cover plate and the rear plate may be covered with high-temperature cloth to prevent the overflow of the encapsulation adhesive film during the lamination. Moreover, the wiring member passing through the rear plate is kept abutting against the rear plate during the lamination, that is, during the lamination, the part of the wiring member emerging from the rear plate is bent, so that the part of the wiring member emerging from the rear plate is kept abutting against the rear plate, thereby preventing affecting the closure of the laminating chamber of the laminating machine. When the lamination is completed and the photovoltaic laminate is obtained, the wiring member abutting against the rear plate may be straightened, so that the part of the wiring members emerging from the rear plate is vertical to the rear plate, so that the wiring members can be introduced into the junction box when arranging the junction box. Furthermore, when the lamination is completed and the photovoltaic laminate is obtained, detection may be performed on the photovoltaic laminate for defects such as hidden cracks, fragments, cold joint or the like.

After the production of the photovoltaic laminate, the junction box is arranged on the photovoltaic laminate. The junction box may be fixed on the photovoltaic laminate by adhesive, and correspond to the position of the wiring member. The junction box is arranged on a surface of the rear plate of the photovoltaic laminate. Moreover, the wiring member introduced into the junction box may be pressed on the bonding pad in the junction box through an indenter. In this way, inspection can be performed on the positions of the wiring member and the junction box before welding.

In general, one or more junction boxes may be arranged on the photovoltaic laminate. For example, the number of the junction boxes arranged on the photovoltaic laminate may be 2 to 6, preferably 3. Furthermore, the junction box may be arranged near an edge of the photovoltaic laminate or near the center of the photovoltaic laminate. When the junction box is arranged near the center of the photovoltaic laminate, it is preferentially arranged on a centerline of the photovoltaic laminate, and is further preferentially arranged on a centerline of a long side of the photovoltaic laminate. There is at least one diode inside each junction box arranged on the photovoltaic laminate, and the electrical connection between the at least one diode and the wiring member in a photovoltaic module is implemented according to the present disclosure.

Figure 13:
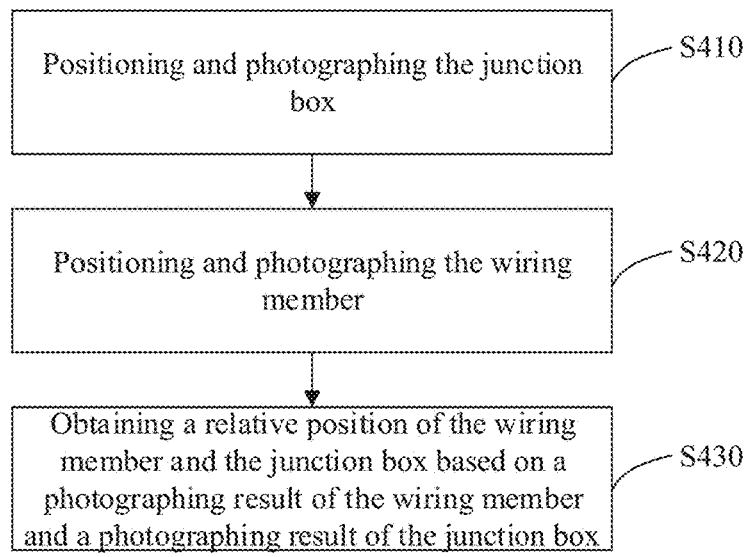
FIG. 13 is a flow chart of steps for visual inspection of relative position of the wiring member and the junction box according to some embodiments of the present disclosure.

In some embodiments, as shown in FIG. 13, the operation S400 of performing pre-welding visual inspection on the relative position of the wiring member and the junction box includes:

S410: positioning and photographing the junction box.

During the inspection by the visual inspection system, it is necessary to position the object to be inspected first. After knowing the position of the object to be inspected, accurate photographing is performed on the junction box, to accurately identify the position of the junction box based on the structural features in the junction box. In some embodiments, the accurate position of the junction box may be inspected based on the peripheral contour features or internal component features of the junction box.

S420: positioning and photographing the wiring member.

Similar to the junction box, when inspecting the position of the wiring member, the position of the wiring member is acquired first, and then accurate photographing is performed on the wiring member. The position of the wiring member is inspected based on the structural characteristics of the wiring member.

S430: obtaining the relative position of the wiring member and the junction box based on a photographing result of the wiring member and a photographing result of the junction box.

After obtaining the accurate position of the junction box and the accurate position of the wiring member, the relative position of the wiring member and the junction box can be obtained. Thus, the actual position of the wiring member relative to the bonding pad in the junction box can also be obtained. In this way, it is conducive to controlling the actual welding position of the wiring member relative to the bonding pad in the junction box.

Figure 14:
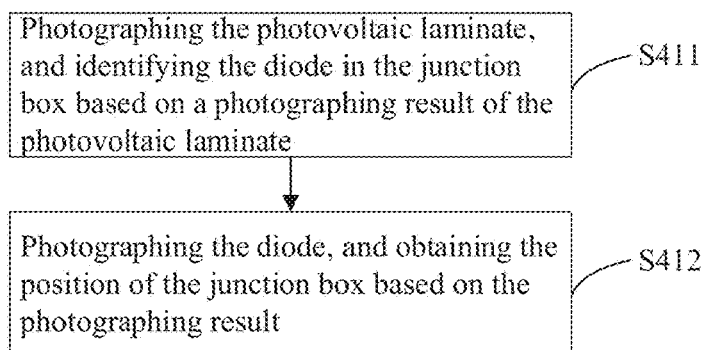
FIG. 14 is a flow chart of steps for positioning and photographing the junction box according to some embodiments of the present disclosure.

In some embodiments, as shown in FIG. 14, the operation S410 of positioning and photographing the junction box includes:

S411: photographing the photovoltaic laminate, and identifying the diode in the junction box based on a photographing result of the photovoltaic laminate.

Figure 16:
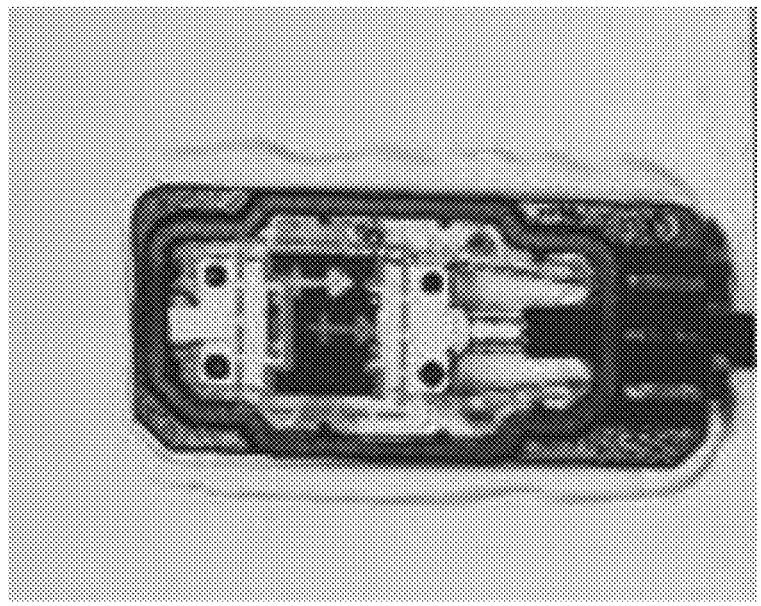
FIG. 16 is a schematic diagram of photographing result of the photovoltaic laminate before welding according to some embodiments of the present disclosure.

The junction box is arranged on a surface of the rear plate of the photovoltaic laminate. During welding, the surface of the rear plate of the photovoltaic laminate is facing up. Photographing is performed on the photovoltaic laminate to obtain image of the surface of the rear plate of the photovoltaic laminate. The image of the photovoltaic laminate includes the pixel characteristics of the junction box. Since the diode is fixed in the junction box with an unchanged position, the position of the junction box can be obtained by obtaining the position of the diode. Therefore, the position of the junction box can be obtained by identifying the specific pixel features in the photographing result of the photovoltaic laminate, that is, the diodes in the junction box. It is noted that the identification of the diode may be realized by color identification. The packaging color of diode in the junction box is black, which is obviously distinguished from the metal color of surrounding bonding pads. Thus, it is easy to identify the diode. Moreover, a character label may be formed on the packaging material of the diode to reflect the parameter characteristics of the diode. The character label on the packaging material of the diode is conducive to identifying the diode features in the image of the photovoltaic laminate. FIG. 16 shows the image of the photographing result of the photovoltaic laminate. It can be seen that the diode in the junction box has obvious dark black color characteristics compared with the surrounding bright white bonding pads.

S412: photographing the diode, and obtaining the position of the junction box based on the photographing result.

Figure 17:
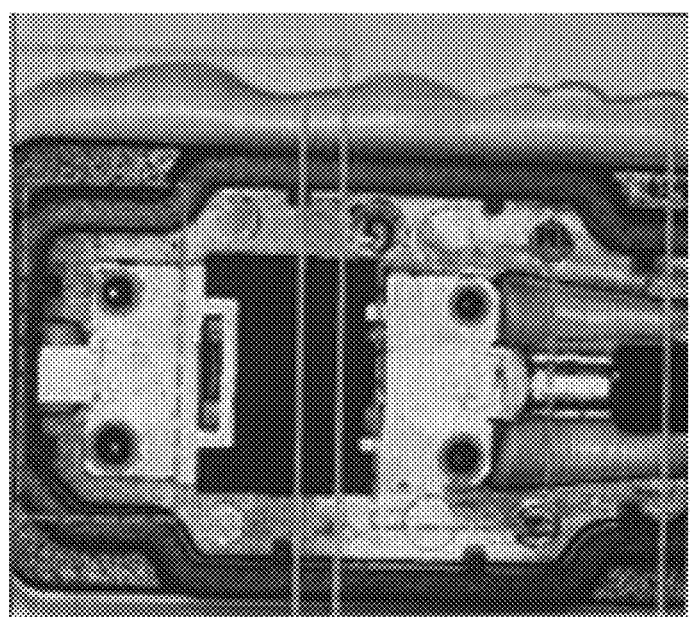
FIG. 17 is a schematic diagram of photographing result of position of the diode before welding according to some embodiments of the present disclosure.

After obtaining the position of the junction box by identifying the characteristics of the diode in the image of the photovoltaic laminate, photographing is performed on the diode in the junction box, and the accurate position of the diode can be obtained based on the relative position relationship of the external contour or the character label of the diode and the photographing center point in the diode image, to obtain the accurate position of the junction box. FIG. 17 shows the image of the photographing result of the diode. It can be seen that the junction box is obviously located at the center of the image. Thus, the position of the junction box can be accurately obtained with the aid of the external contour of the diode.

After obtaining the accurate position of the junction box, inspection is further performed on the accurate position of the wiring member.

Figure 15:
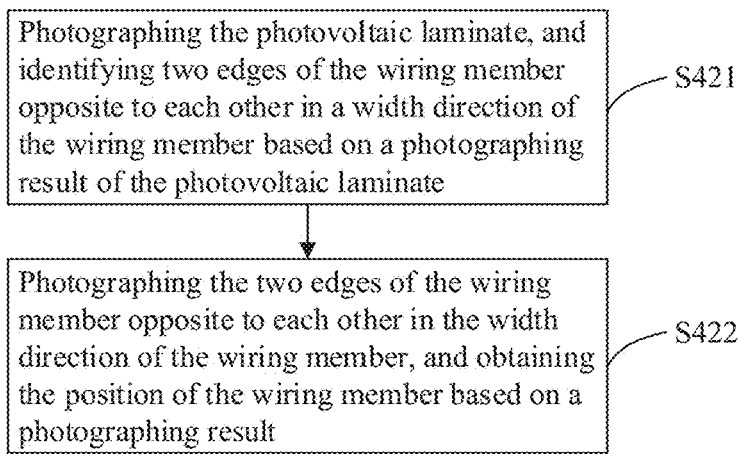
FIG. 15 is a flow chart of steps for positioning and photographing the wiring member according to some embodiments of the present disclosure.

In some embodiments, as shown in FIG. 15, the operation S420 of positioning and photographing the wiring member includes:

S421: photographing the photovoltaic laminate, and identifying two edges of the wiring member opposite to each other in a width direction of the wiring member based on a photographing result of the photovoltaic laminate.

Similar to obtaining the position of the junction box, during the position inspection on the wiring member, photographing is performed on the photovoltaic laminate first, and the resulting image of the photovoltaic laminate includes the pixel characteristics of the wiring member. When the wiring member is pressed on the bonding pad in the junction box, the two edges opposite to each other in the width direction of the wiring member are located in the welding region on the bonding pad. Thus, in the obtained image of the photovoltaic laminate, the wiring member can be identified by the boundary lines formed by the two edges of the wiring member opposite to each other in the width direction, thereby obtaining the position of the wiring member.

S422: photographing the two edges of the wiring member opposite to each other in the width direction of the wiring member, and obtaining the position of the wiring member based on a photographing result.

Figure 18:
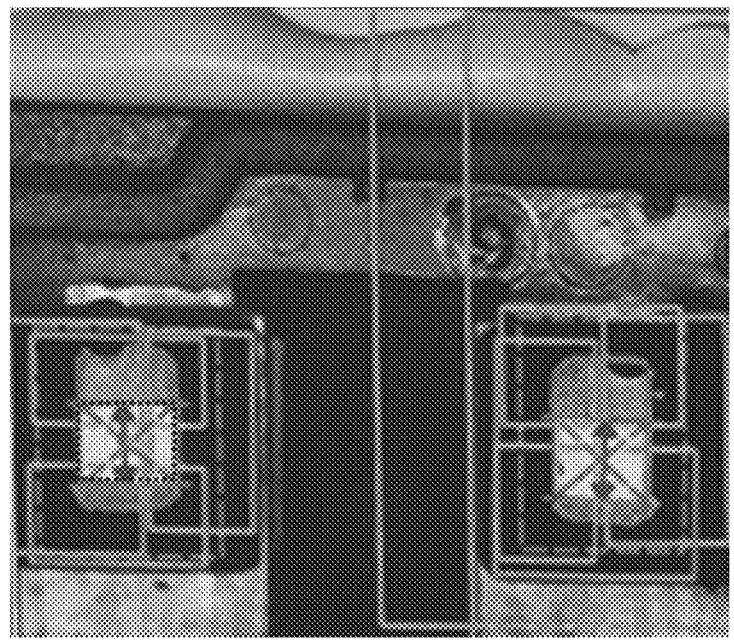
FIG. 18 is a schematic diagram of photographing result of position of the wiring member before welding according to some embodiments of the present disclosure.

After obtaining the position of the wiring member by identifying the edge features of the wiring member in the image of the photovoltaic laminate, photographing is performed on the wiring member in the junction box, and the accurate position of the wiring member can be detected and obtained based on the relative position relationship of the external contour of the wiring member in the image of the wiring member and the photographing center point. FIG. 18 shows the image of the photographing result of the wiring member. It can be seen that the two edges of the wiring member opposite to each other in the width direction have obvious bright white color characteristics (the edges as shown by the upper and lower long sides of the rectangle dotted line box on the left side in FIG. 18). The position of the wiring member can be accurately obtained by the two edges of the wiring member opposite to each other in the width direction of the wiring member.

After obtaining the accurate positions of the junction box and the wiring member respectively, the positions of the junction box and the wiring member are compared to obtain the relative positions of the wiring member and the junction box. That is to say, according to the accurate positions of the junction box and the wiring member, the actual position of the wiring member in the junction box can be obtained. After the accurate position of the junction box is determined, the position of the bonding pad in the junction box can be determined. In this way, the actual position of the wiring member pressed on the bonding pad in the junction box can be obtained, so as to judge whether the position of the wiring member on the bonding pad in the junction box is deviated.

In some embodiments, after the position inspection of the relative position of the wiring member and the bonding pad, and before the laser welding of the wiring member and the bonding pad with the laser head, the method further includes adjusting a welding position of the laser head according to the relative position of the wiring member and the junction box.

It can be understood that during pressing of the wiring member on the bonding pad in the junction box with an indenter, the actual pressing position may deviate due to the surface flatness of the wiring member, the surface flatness of the bonding pad, or the center of gravity of the indenter. After the relative position of the wiring member and the junction box is obtained by the visual inspection system, the welding position of the laser head may be adjusted according to the relative position, so that the welding can be carried out in the predetermined paths on surface of the wiring member. In this way, deviation welding and wrong welding can be prevented from occurring, and penetration of bonding pads caused due to deviation welding can be prevented.

In the actual welding process, the laser head may weld on surface of the wiring member along a path of straight line or curve. Moreover, the laser head may perform welding on the wiring member and the bonding pad along a closed path or a non-closed path. In other words, a weld seam formed by the path of laser on the surface of the wiring member may be in a form of a straight line or a curve. Furthermore, the weld seam formed by the path of laser on the surface of the wiring member may be in a form of a closed shape, such as a rectangle, a circle or the like, or in a form of a non-closed shape, such as a wavy shape, a S shape, or the like.

It is necessary to inspect the weld seams formed by welding to determine whether the finally formed welding products meet the requirements. Generally, the parameter characteristics of the qualified weld seams, such as the ranges of length characteristics, width characteristics or depth characteristics of the weld seam, may be obtained through pre-test. In order to judge the welding quality of the wiring member subjected to laser welding. In practice, qualified products may be selected for testing to obtain the conditions under which the weld seams on surface of the wiring member can meet the welding quality requirements.

In some embodiments, performing post-welding visual inspection on the weld seams subjected to the laser welding includes photographing the weld seams to inspect whether widths of the weld seams range from 0.3 mm to 0.4 mm.

Figure 19:
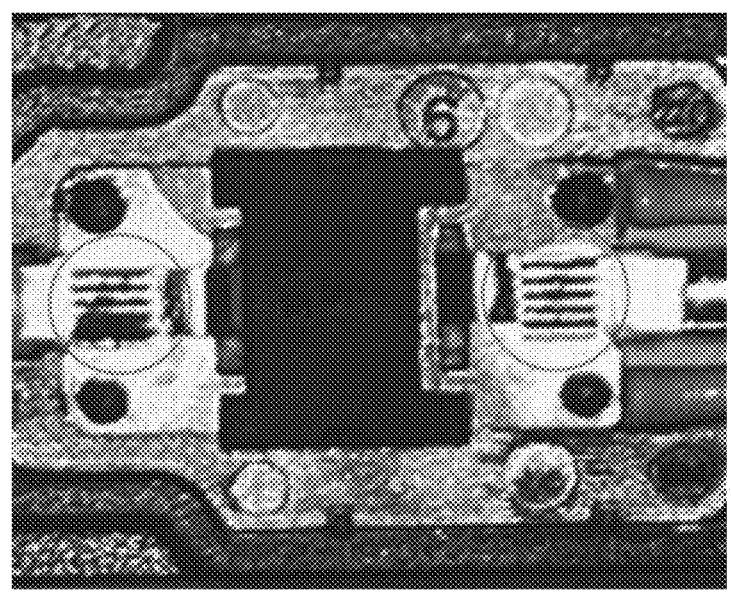
FIG. 19 is a schematic diagram of photographing result of position of the wiring member after welding according to some embodiments of the present disclosure.

That is to say, after the welding between the wiring member and the bonding pad in the junction box, whether the welding quality meets the requirements may be judged by detecting the widths of the weld seams on surface of the wiring member. When a width of a weld seam is greater than or equal to 0.3 mm and less than or equal to 0.4 mm, the welding quality may be considered to meet the requirements. When a width of a weld seam is less than 0.3 mm or more than 0.4 mm, the welding quality may be considered to not meet the requirements. FIG. 19 shows the image of photographing result of the position of the welded wiring member. Some of the parallel weld seams on the left of the image are too wide, resulting in interference between adjacent weld seams, that is, the welding regions of adjacent weld seams are partially overlapped (as shown in FIG. 19, the black block area formed by the interconnection of two parallel black seams in the circle on left), and the corresponding welding quality is poor. In contrast, the parallel weld seams on the right side of the image are evenly distributed, and there is a significant gap (i.e. the white bright area between two parallel black seams in the circle on right side of FIG. 19) between adjacent weld seams, and the corresponding welding quality is good.

In some embodiments, the operation of performing, by a laser head, laser welding on the wiring member and the bonding pad further includes detecting, by a photoelectric sensor, light radiation signals in the process of welding by the laser head.

By inspecting the welding process between the wiring member and the bonding pad in the junction box, defects occurring in the welding process can be identified in real time. In this way, combined with the pre-welding position inspection by the visual inspection system, a good welding quality can be secured, and the welding can be stopped immediately when defects occur.

The optical radiation signal may include any one of visible light signal, laser reflection signal and infrared light signal and the combination thereof.

It is noted that the laser welding process is accompanied by light radiation, including visible light, laser reflection and infrared light. These radiated optical signals can reflect welding states and defects in the welding process. The visible light comes from metal vapor, the laser reflection comes from laser signal emitted from laser head, and the infrared light comes from thermal radiation of metal molten pool formed by laser irradiation. The photoelectric sensor can convert the optical radiation signal generated in the welding process into electrical signal, and then transmit the electrical signal to the inspection system. Through the analysis of the optical radiation signal by the inspection system, the welding quality of the wiring member can be obtained, so as to achieve defect detection and quality monitoring. Different optical radiation signals may be detected by different photoelectric sensors.

In the results of visible light detection, the attenuation of visible light signal indicates that the volume of metal vapor decreases during welding, and the enhancement of visible light signal indicates that the volume of metal vapor increases during welding. In the detection result for laser reflection signal, the attenuation of the laser reflection signal indicates that depth of keyhole formed by laser irradiation decreases and the laser reflected by the keyhole decreases due to laser power attenuation; and the enhancement of the laser reflection signal indicates that absorption of laser energy by the metal decreases and the laser reflection increases. In the detection result for infrared signal, the attenuation of the infrared signal indicates that the energy reaching the molten pool reduces, resulting in the reduction of the thermal radiation of the molten pool, and the enhancement of infrared light signal indicates that the energy reaching the molten pool increases, resulting in the increase of thermal radiation of the molten pool.

In practice, threshold values may be set for each light radiation signal to determine whether defects occur in the welding process. The threshold values can also be obtained through testing. Based on the ranges of corresponding light radiation signals to which the welding quality of the wiring member and the bonding pad in the junction box meets the requirements, the control range of each light radiation signal in the welding process can be obtained. When a light radiation signal exceeds the corresponding threshold value, it indicates that welding defects are likely to occur in the welding process, and then the welding process can be controlled according to whether the detection results for each light radiation signal exceed the threshold value.

In some embodiments, when laser welding is performed on the wiring member and the bonding pad by the laser head, the power of laser emitted by the laser head is greater than or equal to 550 W and less than or equal to 750 W, and the welding speed is greater than or equal to 60 mm/s and less than or equal to 100 mm/s.

For example, in practice, the power of laser emitted by the laser head may be 550 W, 580 W, 600 W, 620 W, 640 W, 660 W, 680 W, 700 W, 720 W or 750 W, and the welding speed of the laser head may be 60 mm/s, 70 mm/s, 80 mm/s, 90 mm/s or 100 mm/s.

By controlling the welding power of the laser head, the energy intensity, at surface of the wiring member, of the laser emitted by the laser head can be controlled, so that the energy intensity of the laser reaching the surface of the wiring member during the welding can be controlled within a reasonable range. In this way, problems of undesired welding depth due to low energy intensity of laser, and of penetration of bonding pad due to high energy of laser can be prevented.

Moreover, by controlling the welding speed of the laser head, the final welding products meeting the quality requirements can be formed. In this way, excessively wide weld seams due to laser running in the welding region for too long time resulted from an excessively low welding speed can be prevented, and excessively narrow weld seams caused by an excessively high welding speed also can be prevented.

Furthermore, since the widths of the weld seams can reflect the welding quality to a certain extent, in order to make the welding quality of the connection structure between the wiring member and the bonding pad in the photovoltaic module meet the requirements, in practice, the width of the radiation area by laser emitted by the laser head on surface of the wiring member may be controlled, so as to ensure the welding quality between the wiring member and the bonding pad. In some embodiments, when the widths of the weld seams on the wiring member is greater than or equal to 0.3 mm and less than or equal to 0.4 mm, it can be considered that the welding quality meets the requirements. Therefore, the width of the irradiation area by the laser emitted from the laser head on surface of the wiring member may be controlled to be within the range of 0.3 mm to 0.4 mm.

In some embodiments, introducing the wiring member of the photovoltaic laminate into the junction box includes bending the wiring member and sticking the bent part into the junction box.

The wiring member may be bent by 90 degrees, and the bent part is perpendicular to a surface of the rear plate of the photovoltaic laminate. By sticking the bent part into the junction box, the bent part can be parallel to the bonding pad in the junction box and abut against the bonding pad in the junction box.

Figure 20:
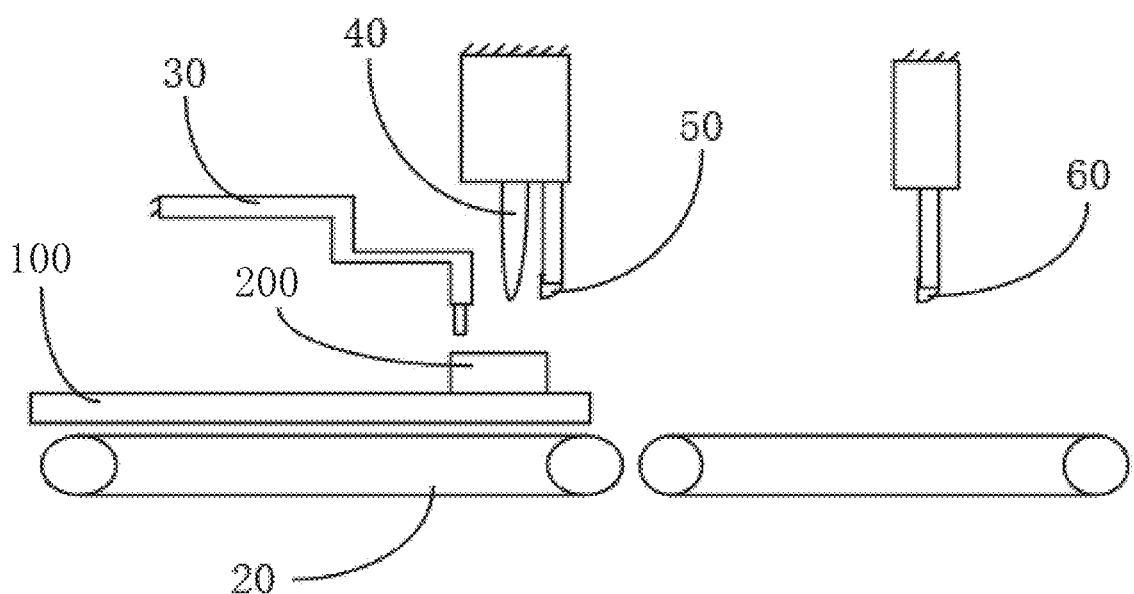
FIG. 20 is a structural schematic diagram of a device for manufacturing the photovoltaic module according to some embodiments of the present disclosure.

As shown in FIG. 20, some embodiments of the present disclosure further provide a device for producing a photovoltaic module, including a bearing mechanism 20, a pressing mechanism 30, a laser head 40 and a visual inspection system. The bearing mechanism 20 is configured to bear the photovoltaic laminate 100. The pressing mechanism 30 is configured to press the wiring member on the bonding pad in the junction box 200 on the photovoltaic laminate 100. The laser head 40 is configured for laser welding performed on the wiring member and the bonding pad. The visual inspection system includes a first visual inspector 50 and a second visual inspector 60. The first visual inspector 50 is configured for pre-welding visual inspection of the relative position of the wiring member and the junction box 200, and the second visual inspector 60 is configured for post-welding visual inspection of the weld seams obtained by laser weld.

The bearing mechanism 20 not only bears the photovoltaic laminate 100, but also transmits the photovoltaic laminate 100. The pressing mechanism 30 may adopt a telescopic and transmission structure to realize the movement of the indenter. The first visual inspector 50 and the second visual inspector 60 may be implemented by CCD cameras and be electrically connected to a same control center. The images taken by the first visual inspector 50 and the second visual inspector 60 may be sent to the same control center, so that the relative position of the wiring member and the junction box 200, as well as the weld seams obtained by laser weld, can be visually inspected in sequence during the manufacturing process of the photovoltaic module monitored on a same monitoring screen.

Although the present disclosure is disclosed above with exemplary embodiments, they are not used to limit the claims. Any person skilled in the art can make some possible changes and modifications without departing from the concept of the present disclosure. The scope of protection of the present disclosure shall be subject to the scope defined by the appended claims.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure.

What is claimed is:

1. A photovoltaic module, comprising:
   a photovoltaic laminate and a junction box;
   wherein the photovoltaic laminate comprises a plurality of solar cells, at least one solder strip, a rear plate and a wiring member, the plurality of solar cells are electrically connected by the at least one solder strip to form at least one cell string, the at least one cell string is stacked over the rear plate, and the at least one solder strip is electrically connected with the wiring member;
   wherein the junction box is fixed and connected to a side of the rear plate away from the plurality of solar cells, and the junction box comprises a bonding pad;
   wherein the wiring member passes through an opening defined on the rear plate and abuts the bonding pad, and the wiring member is connected with the bonding pad by a plurality of weld seams formed by laser welding; and
   wherein the plurality of weld seams are formed in a welding region between the wiring member and the bonding pad, the plurality of weld seams are configured to connect the wiring member and the bonding pad to form an integrated structure, wherein each of the plurality of weld seams extends from the wiring member towards an interior of the bonding pad, and an extension depth of each of the plurality of weld seams in the bonding pad is not greater than 80% of a thickness of the bonding pad.

2. The photovoltaic module according to claim 1, wherein the plurality of weld seams penetrate the wiring member and form a shape of straight lines, polygonal lines or curves on a surface of the wiring member away from the plurality of solar cells.

3. The photovoltaic module according to claim 1, wherein the bonding pad comprises a plurality of recesses formed on a surface of the bonding pad facing to the wiring member and in the welding region, each of the plurality of recesses surrounds a respective weld seam, and there is a gap between each of the plurality of recesses and a surface of the wiring member facing to the bonding pad.

4. The photovoltaic module according to claim 1, wherein each of the plurality of weld seams comprises a first segment formed in the wiring member and a second segment formed in the bonding pad, and the first segment and the second segment are interconnected at an interface between the wiring member and the bonding pad.

5. The photovoltaic module according to claim 4, wherein a width of the first segment is constant in a direction directing from the wiring member to the bonding pad, or the width of the first segment decreases in the direction directing from the wiring member to the bonding pad.

6. The photovoltaic module according to claim 4, wherein a width of the second segment is constant in a direction directing from the wiring member to the bonding pad, or the width of the second segment decreases in the direction directing from the wiring member to the bonding pad.

7. The photovoltaic module according to claim 1, wherein the plurality of weld seams form a shape of straight lines on a surface of the wiring member away from the plurality of solar cells, and the plurality of weld seams distribute in a width direction of the wiring member; and a length of each of the plurality of weld seams is not less than 3 mm and not greater than 5 mm, and a width of each of the plurality of weld seams is not less than 0.3 mm and not greater than 0.4 mm.

8. The photovoltaic module according to claim 1, wherein the plurality of weld seams form a shape of straight lines on a surface of the wiring member away from the plurality of solar cells, and a distance between adjacent weld seams is not less than 0.4 mm and not greater than 0.6 mm.

9. The photovoltaic module according to claim 1, wherein a region in which the wiring member abuts the bonding pad has a first area, the welding region has a second area, and the second area is 30% to 60% of the first area.

10. The photovoltaic module according to claim 9, wherein the second area is 40% to 50% of the first area.

11. The photovoltaic module according to claim 1, wherein the plurality of weld seams comprise a first weld seam and a second weld seam, the first weld seam forms a closed pattern, and the second weld seam is formed in the closed pattern formed by the first weld seam.

12. The photovoltaic module according to claim 11, wherein the first weld seam forms a shape identical to that formed by the second weld seam on a surface of the wiring member away from the plurality of solar cells.

13. The photovoltaic module according to claim 11, wherein the plurality of weld seams further comprise a third weld seam, the second weld seam forms a closed pattern, and the third weld seam is formed in the closed pattern formed by the second weld seam.

14. The photovoltaic module according to claim 1, wherein a positioning region is defined on the bonding pad, and the positioning region occupies a part of or a whole surface of the bonding pad facing to the wiring member; and a facing region in which the wiring member abuts the bonding pad is defined on the bonding pad, the positioning region has an area greater than an area of the facing region, and the facing region is defined within the positioning region.

15. The photovoltaic module according to claim 14, wherein the positioning region has two first boundaries opposite to each other in a first direction, the facing region is defined between the two first boundaries, and there is a spacing between the facing region and either one of the two first boundaries.

16. The photovoltaic module according to claim 15, wherein the positioning region has two second boundaries opposite to each other in a second direction perpendicular to the first direction, the welding region is defined between the two second boundaries, and there is a spacing between the welding region and either one of the two second boundaries.

17. The photovoltaic module according to claim 1, comprising two bonding pads and two wiring members, wherein each of the two bonding pads is connected with a respective wiring member of the photovoltaic laminate.

18. The photovoltaic module according to claim 17, wherein the junction box further comprises a diode, one end of the diode is electrically connected to one of the two bonding pads, and the other end of the diode is electrically connected to the other bonding pad.

19. The photovoltaic module according to claim 18, wherein the diode is arranged between the two bonding pads, and the diode and the two bonding pads form a shape of U.

* * * * *